US008872580B2

(12) United States Patent
Alzaher

(10) Patent No.: US 8,872,580 B2
(45) Date of Patent: Oct. 28, 2014

(54) RECONFIGURABLE HIGH-ORDER INTEGRATED CIRCUIT FILTERS

(75) Inventor: Hussain Alzaher, Dhahran (SA)

(73) Assignees: King Fahd University of Petroleum and Minerals, Dhahran (SA); King Abdulaziz City for Science and Technology, Riyadh (SA)

( * ) Notice: Subject to any disclaimer, the term of this patent is extended or adjusted under 35 U.S.C. 154(b) by 186 days.

(21) Appl. No.: 13/550,255

(22) Filed: Jul. 16, 2012

(65) Prior Publication Data

US 2014/0015602 A1   Jan. 16, 2014

(51) Int. Cl.
  *H03K 17/16*   (2006.01)
(52) U.S. Cl.
  USPC ........................................................ 327/553
(58) Field of Classification Search
  None
  See application file for complete search history.

(56) References Cited

U.S. PATENT DOCUMENTS

| | | | |
|---|---|---|---|
| 6,661,280 B2 | 12/2003 | Derks | |
| 7,266,351 B2 * | 9/2007 | Marholev | 455/130 |
| 7,398,065 B1 | 7/2008 | Abbey | |
| 7,970,358 B2 * | 6/2011 | Darabi et al. | 455/86 |
| 7,984,093 B1 * | 7/2011 | Tu et al. | 708/819 |
| 8,461,917 B2 * | 6/2013 | Chang et al. | 327/552 |
| 8,482,344 B2 | 7/2013 | Oishi | |
| 8,508,291 B1 * | 8/2013 | Alzaher | 327/553 |
| 8,594,603 B2 * | 11/2013 | Balankutty et al. | 455/296 |
| 8,659,363 B2 * | 2/2014 | Kamat et al. | 331/135 |
| 2003/0207679 A1 | 11/2003 | Kaczynski et al. | |
| 2004/0232977 A1 | 11/2004 | Lee et al. | |
| 2006/0091963 A1 | 5/2006 | Menkhoff | |
| 2010/0237964 A1 | 9/2010 | Teraguchi et al. | |
| 2010/0297976 A1 | 11/2010 | Chien | |
| 2011/0215886 A1 | 9/2011 | Kawai et al. | |

FOREIGN PATENT DOCUMENTS

CN    101051833 A    10/2007

OTHER PUBLICATIONS

Digitally programmable high-order current-mode universal filters, Alzaher, H.A. et al., May 2011, Analog Integrated Circuits and Signal Processing, vol. 67 No. 2, pp. 179-187.
Chen et al., IEE Proceedings Circuits, Devices & Systems, Oct. 2001,—vol. 148, Issue 5, p. 242-249, doi:10.1049/ip-cds:20010523 (http://digital-library.theiet.org/getabs/servlet/GetabsServlet?prog=normal&id=ICDSE7000148000005000242000001&idtype=cvips&gifs=yes&ref=no).

(Continued)

*Primary Examiner* — Lincoln Donovan
*Assistant Examiner* — Terry L Englund
(74) *Attorney, Agent, or Firm* — Richard C. Litman

(57) ABSTRACT

Voltage and current mode reconfigurable $n^{th}$-order filters (RNOFs) fabricated in a 0.18 μm CMOS process are disclosed. The RNOFs utilize an inverse-follow-the-leader-feedback (IFLF) signal path with summed outputs, resulting in a follow-the-leader-feedback-summed-outputs (FLF-SO) filter topology. The FLF-SO filter uses multi-output current amplifiers (CAs). Inverse-follow-the-leader-feedback-summed-outputs (IFLF-SO) and inverse-follow-the-leader-feedback-distributed-outputs (IFLF-DI) structures are realized by employing $3n+4$ transconductance amplifiers (TCAs) for voltage mode processing and two TCAs for current mode signals. A plurality of programmable current division networks (CDNs) tune a digitally controlled current follower (DCCF). A multi-output Digitally Controlled Current Amplifier (MDCCA) controls gain by providing independent filter coefficient control. Forward path output gains are set to unity. Alternatively, a multi-output digitally controlled CCII block (MDCCCII) uses CCII in the first stage. Such filters provide independent tuning of both numerator as well as denominator coefficients and are reconfigurable without the need of switches due to CDNs setting undesired output current to zero.

6 Claims, 21 Drawing Sheets

(56) References Cited

OTHER PUBLICATIONS

Kamel et al., IEEE 54th International Midwest Symposium on Circuits and Systems (MWSCAS), 2011, Issue Date: Aug. 7-10, 2011, pp. 1-4 (http://ieeexplore.ieee.org/xpl/freeabs_all.jsp?arnumber=6026582).

Ranjan et al., Scientific Research, "Nth Order Voltage Mode Active-C Filter Employing Current Controlled Current Conveyor," Circuits and Systems, 2011,2, pp. 85-90, doi: 10.4236/cs.2011.22013, Apr. 2011 (http://www/SciRP.org/journal/cs).

Songkla et al., International Journal of Electronics and Eslectrical Engineering, "Realization of Electronically Tunable Current-Mode First-Order Alipass Filter and Its Application," Jun. 2012, pp. 40-43.

Alzaher, IEEE transactions on Circuits and Systems-II, "A CMOS Digitally Programmable Universal Current-Mode Filter," express Briefs, vol. 55, No. 8, Aug. 2008, pp. 758-762.

\* cited by examiner

RECONFIGURABLE HIGH-ORDER INTEGRATED CIRCUIT FILTERS

BACKGROUND OF THE INVENTION

1. Field of the Invention

The present invention relates to integrated circuit filters, and particularly to reconfigurable high-order integrated circuit filters.

2. Description of the Related Art

Current-mode building blocks (CMBBs), transconductance amplifiers (gm), and operation transconductance amplifiers (OTAs) have been used to realize several high-order filters. Such filters, however, have a single output, and modifying the filter type would require changes in the hardware. In addition, the absence of a programmability feature hinders the use of most of these filters in integrated circuit (IC) applications.

Thus, reconfigurable high-order integrated circuit filters solving the aforementioned problems are desired.

SUMMARY OF THE INVENTION

The reconfigurable high-order integrated circuit filters are voltage- and current-mode reconfigurable $n^{th}$-order filters (RNOFs) fabricated in a 0.18 μm Complementary Metal-Oxide Semiconductor (CMOS) process. The novel RNOFs utilize an inverse-follow-the-leader-feedback (IFLF) signal path with summed outputs. This results in a follow-the-leader-feedback-summed-outputs (FLF-SO) filter topology. The FLF-SO filter is realized using multi-output current amplifiers (CAs). Inverse-follow-the-leader-feedback-summed-outputs (IFLF-SO) and inverse-follow-the-leader-feedback-distributed-inputs (IFLF-DI) structures are realized by employing 3n+4 transconductance amplifiers (TCAs) for voltage mode processing and two TCAs for current-mode signals. Programmability is achieved using a plurality of current division networks (CDNs) for tuning a digitally controlled current follower (DCCF). Gain control is realized by utilizing a multi-output Digitally Controlled Current Amplifier (MDCCA), which provides independent control of filter coefficients. Forward path output gains are set to unity. Alternatively, a current conveyor (CCII) is used in the first stage of a multi-output digitally controlled CCII block (MDCCCII). Such filters provide independent tuning of both numerator and denominator coefficients, and are reconfigurable without the need of switches, since the CDNs can be utilized to set the undesired output current to zero, thereby avoiding analog switches in the signal path. The present reconfigurable filters also provide versatile reconfigurable high order filters based on transconductance amplifiers (TCAs), transresistance amplifiers (TRAs), and current amplifiers (CAs) having transfer functions that can be adjusted.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
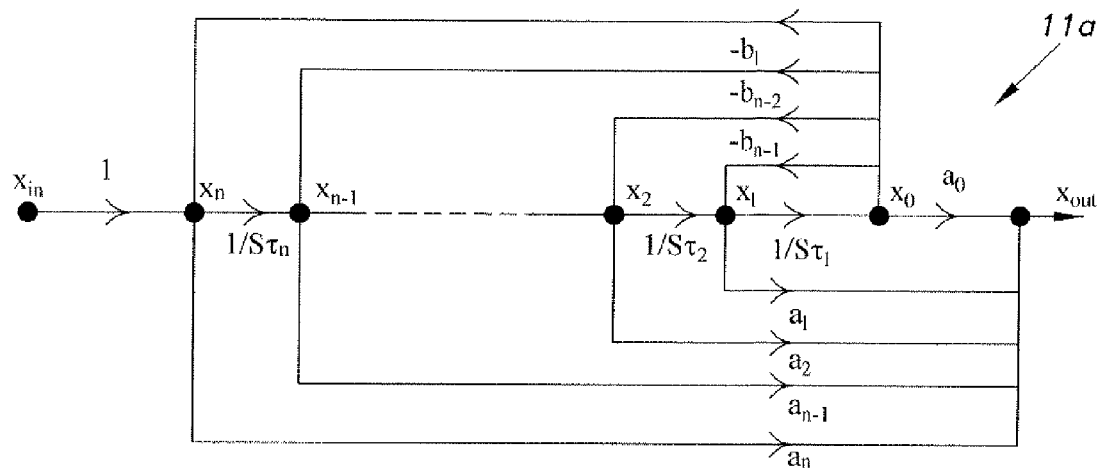
FIG. 1A is a signal flow graph (SFG) showing an exemplary IFLF topology with summed outputs.

The reconfigurable high-order integrated circuit filters are voltage- and current-mode reconfigurable $n^{th}$-order filters (RNOFs) fabricated in a 0.18 μm CMOS process. The filters utilize an inverse-follow-the-leader-feedback (IFLF) signal path with summed outputs. This results in a follow-the-leader-feedback-summed-outputs (FLF-SO) filter topology. The FLF-SO filter is realized using multi-output CAs (current amplifiers). IFLF-SO and IFLF-DI (inverse follow-the-leader-feedback distributed input) structures are realized by employing 3n+4 transconductance amplifiers (TCAs) for voltage-mode processing and two TCAs for current-mode signals. Programmability is achieved using a plurality of current division networks (CDNs) for tuning a digitally controlled current follower (DCCF). Gain control is realized by utilizing a multi-output Digitally Controlled Current Amplifier (MDCCA), which provides independent control of filter coefficients. Forward path output gains are set to unity. Alternatively, a multi-output digitally controlled CCII block (MDCCCII) uses a current conveyor (CCII) in the first stage. Such filters provide independent tuning of both numerator and denominator coefficients, and are reconfigurable without the need of switches, since the CDNs can be utilized to set the undesired output current to zero, thereby avoiding analog switches in the signal path. The present filters also provide versatile reconfigurable high order filters based on transconductance, transresistance, and current amplifiers having transfer functions that can be adjusted.

The transfer function (TF) of a general $n^{th}$-order filter (NOF) response can be expressed as:

$$T(s) = \frac{N(s)}{D(s)} = \frac{a_n s^n + a_{n-1} s^{n-1} + \ldots + a_1 s + a_0}{s^n + b_{n-1} s^{n-1} + \ldots + b_1 s + b_0} \tag{1}$$

where $a_0$ through $a_n$ are real numbers, and $b_0$ through $b_{n-1}$ are positive real numbers. Research related to NOFs has mainly focused on the utilization of the transconductance amplifier (TCA) or operational transconductance amplifier (OTA) and the current conveyor. In fact, most of these works were after identifying the canonic structures (employing a minimum number of active devices). A reconfigurable $n^{th}$-order filter (RNOF) is a versatile filter that can be flexibly used to realize any $n^{th}$-order filter function without hardware changes. Hence, the RNOF serves a wide range of applications. Such filters are core parts of systems utilizing reconfigurable analog arrays. A TCA, a transresistance amplifier (TRA), and a current amplifier (CA) may all be used in the design of RNOF.

For topologies 11a and 11b of FIGS. 1A-1B, respectively, it can be shown that the signal at node $x_0$ of the core circuit (without distributed inputs or summed outputs) is given by equation (2), shown below. Also, the signal at the other internal nodes $x_i$ for i=0 to n can be expressed as equation (3), shown below. Therefore, it can be shown that by applying DI (Distributed Input) or SO (Summed Output) methods, the output signal $x_{out}$ can be obtained from equation (4), shown below. Similarly, it can be shown that the topology shown in the SFG 20 of FIG. 2 results in the TF (Transfer Function) given by equation (5), below. On the other hand, it can be shown that a distributed inputs topology can lead to a TF with dependent coefficients for N(s).

$$\frac{x_0(s)}{x_{in}(s)} = \frac{a_0}{\tau_1 \tau_2 \cdots \tau_n s^n + b_{n-1} \tau_1 \tau_2 \cdots \tau_{n-1} s^{n-1} + \cdots + b_2 \tau_{n-1} \tau_n s^2 + b_1 \tau_n s + b_0} \tag{2}$$

$$\frac{x_i(s)}{x_{in}(s)} = \frac{a_0 s^i \prod_{i=1}^{i} \tau_i}{\tau_1 \tau_2 \cdots \tau_n s^n + b_{n-1} \tau_1 \tau_2 \cdots \tau_{n-1} s^{n-1} + \cdots + b_2 \tau_{n-1} \tau_n s^2 + b_1 \tau_n s + b_0} \tag{3}$$

$$T(s) = \frac{x_{out}(s)}{x_{in}(s)} = \frac{a_n \tau_1 \tau_2 \cdots \tau_n s^n + a_{n-1} \tau_1 \tau_2 \cdots \tau_{n-1} \tau_n s^{n-1} + \cdots + a_2 \tau_{n-1} \tau_n s^2 + a_1 \tau_n s + a_0}{\tau_1 \tau_2 \cdots \tau_n s^n + b_{n-1} \tau_1 \tau_2 \cdots \tau_{n-1} s^{n-1} + \cdots + b_2 \tau_1 \tau_2 s^2 + b_1 \tau_1 s + b_0} \tag{4}$$

$$T(s) = \frac{N(s)}{D(s)} = \frac{a_n \tau_1 \tau_2 \cdots \tau_n s^n + a_{n-1} \tau_1 \tau_2 \cdots \tau_{n-1} \tau_n s^{n-1} + \cdots + a_2 \tau_{n-1} \tau_n s^2 + a_1 \tau_n s + a_0}{\tau_1 \tau_2 \cdots \tau_n s^n + b_{n-1} \tau_1 \tau_2 \cdots \tau_{n-1} s^{n-1} + \cdots + b_2 \tau_1 \tau_2 s^2 + b_1 \tau_1 s + b_0} \tag{5}$$

Figure 2:
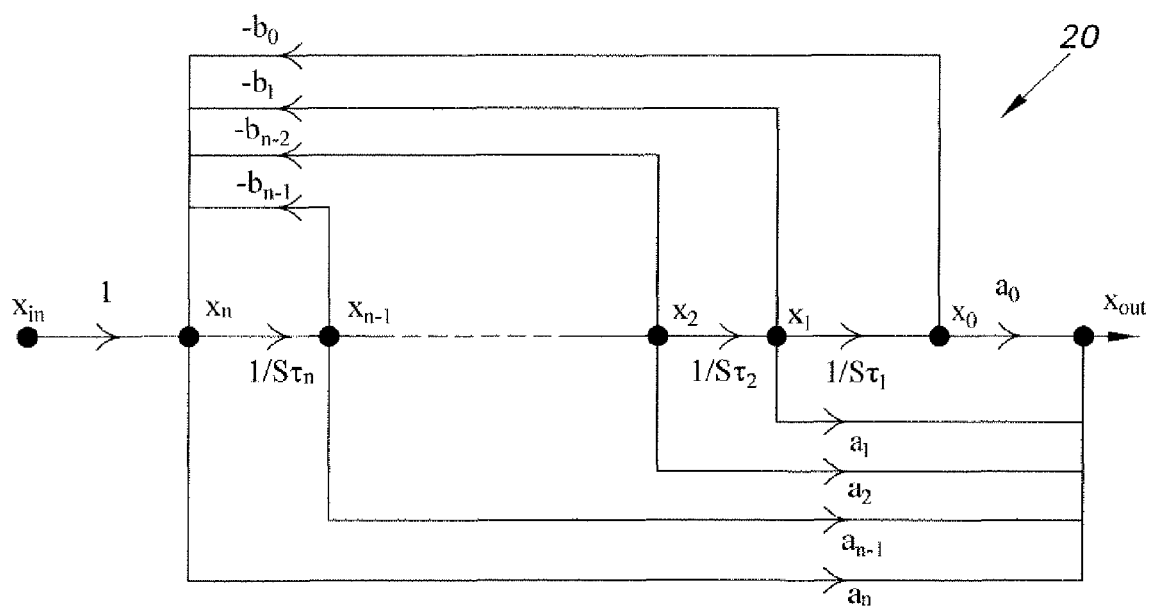
FIG. 2 is a signal flow graph (SFG) showing signal flow in an exemplary FLF topology with summed outputs.

For example, it can be shown that a second-order filter based on the topology of FIG. 2 exhibits the following transfer function:

$$T(s) = \frac{N(s)}{D(s)} = \frac{a_2 \tau_1 \tau_2 s^2 + (a_1 \tau_2 + a_2 \tau_1 b_1) s + a_0}{\tau_1 \tau_2 s^2 + b_1 \tau_1 s + b_0}. \tag{6}$$

Figure 1B:
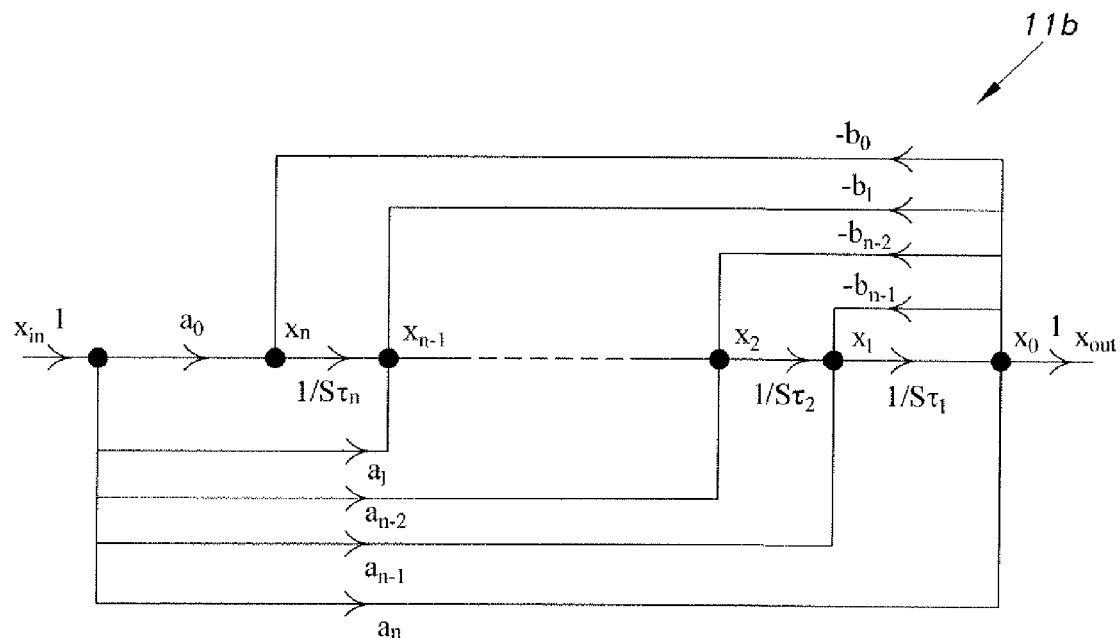
FIG. 1B is a signal flow graph (SFG) showing an exemplary IFLF topology with distributed inputs.

In practice, there could be two different circuit realizations of the signal flow graph (SFG) of FIGS. 1A-1B and FIG. 2 based on the availability of the $s^n$ function of N(s) from the core circuit. The circuits without the $s^n$ term are often canonic in the sense that n devices are required to realize the n integrators. In such cases, $s^n$ is often obtained through subtracting various outputs from the input signal (in the case of voltage-mode circuits), or a copy of the input signal (in the case of current-mode circuits), yielding:

$$X_{out} = a_n X_{in} - \sum_{i}^{n-1} X_i \tag{7}$$

$$= \frac{a_n s^n + (a_{n-1} - b_{n-1}) s^{n-1} + \ldots + a_0 - b_0}{D(s)}.$$

It is clear from equation (7) that several matching conditions are required to obtain the $s^n$ function. In fact, the output component of $s^n$ would not be available from the core circuit unless an extra active element is used prior to the first integrator. Therefore, it can be concluded that the SFGs of FIGS. 1A-1B and FIG. 2 are the most suitable for realizing RNOFs, given that explicit output signal $s^n$ is available. In this case, n active elements are needed to realize the integrators, while an additional element is required to provide the $s^n$ term.

With the help of FIGS. 1A-1B and FIG. 2, voltage- and current-mode RNOFs based on various amplifier types can be developed. The following points can be observed from equations (4) and (5). First, it can be seen that distributing the inputs or summing desired outputs using active elements with programmable gains $a_0$ through $a_n$ inherently results in filters with independent coefficients of N(s). Second, it can be seen that these topologies result in independent tuning of D(s) coefficients if programmable active elements are used to realize the feedback factors ($b_0$ through $b_{n-1}$).

A systematic procedure for developing the present filters starts from basic integrator design. To realize voltage-mode cascadable integrators, the circuit has to have high input impedance and/or low output impedance. A high input impedance integrator can be realized using the TCAs, whereas a low output impedance design can be developed using the voltage amplifiers (Vas) and TRAs. The CA (current amplifier) is not suitable to realize voltage-mode cascadable circuits, since its input and output impedances are low and high, respectively. On the other hand, realizing current-mode cascadable integrators requires devices with high output impedance. This can be implemented using the TCA or the CA.

Figure 3:
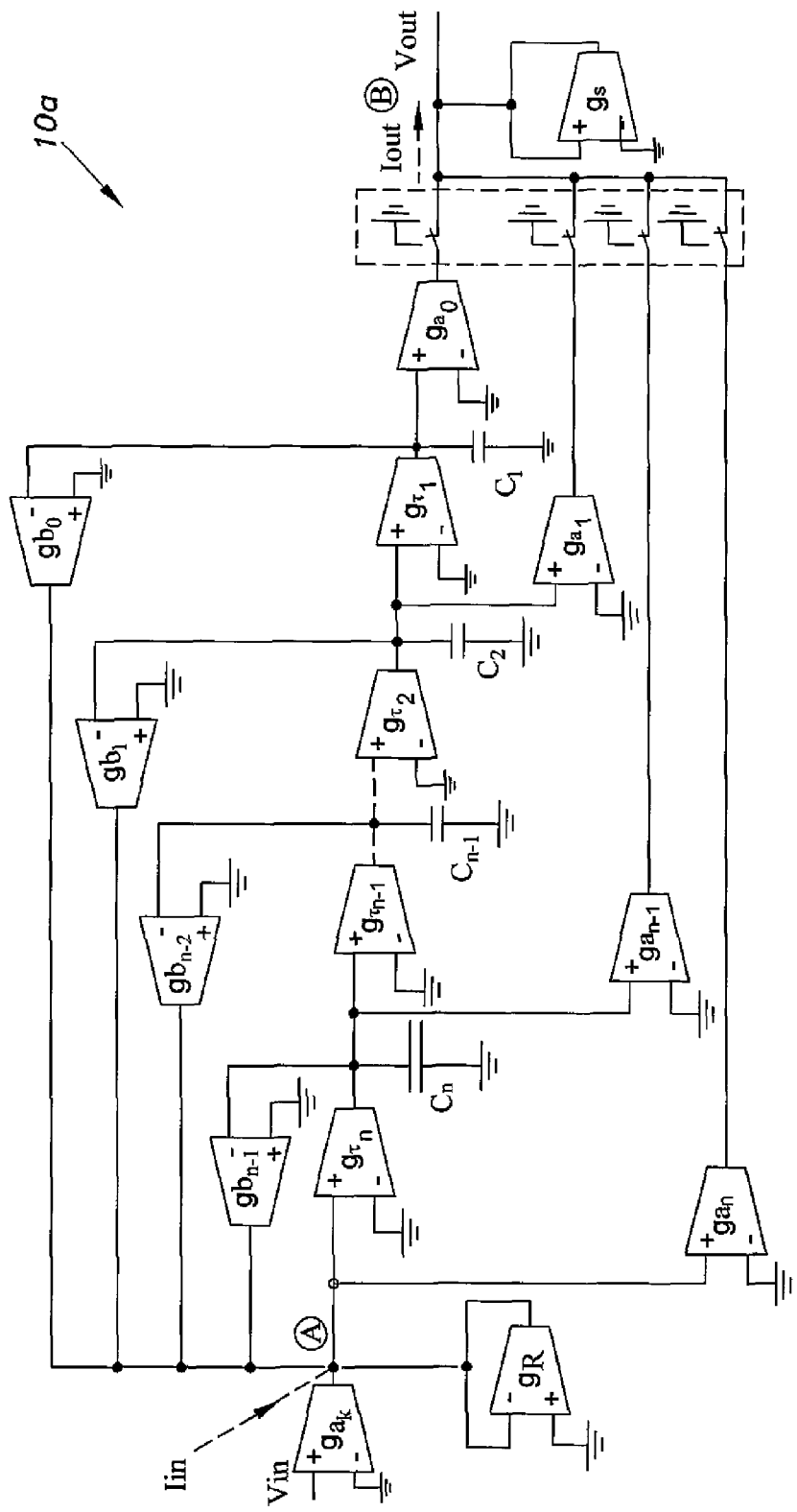
FIG. 3 is a schematic diagram of an FLF-SO filter based on single output TCAs.

In the case of adopting TCA to realize an NOF based on a voltage-mode integrator, an additional transconductor would be required to realize each of the feedback factors. A mixed mode filter 10a (input and output signals can be voltage or current) based on an FLF-SO topology is shown in FIG. 3. The corresponding IFLF-SO and IFLF-DI structures can be easily obtained. It employs (3n+4) TCAs for voltage-mode processing, while two TCAs can be saved for current-mode signals. The non-ideal terminal characteristics of a TCA is often modeled by input capacitance and output capacitance and conductance. For high-frequency operation, the effect of the output conductance is often neglected, since the capacitance would be dominant. Unfortunately, it can be seen that there are two unwanted high-frequency poles associated with this topology due to the amplifiers' capacitances at nodes A and B for the case of voltage mode.

Figure 4:
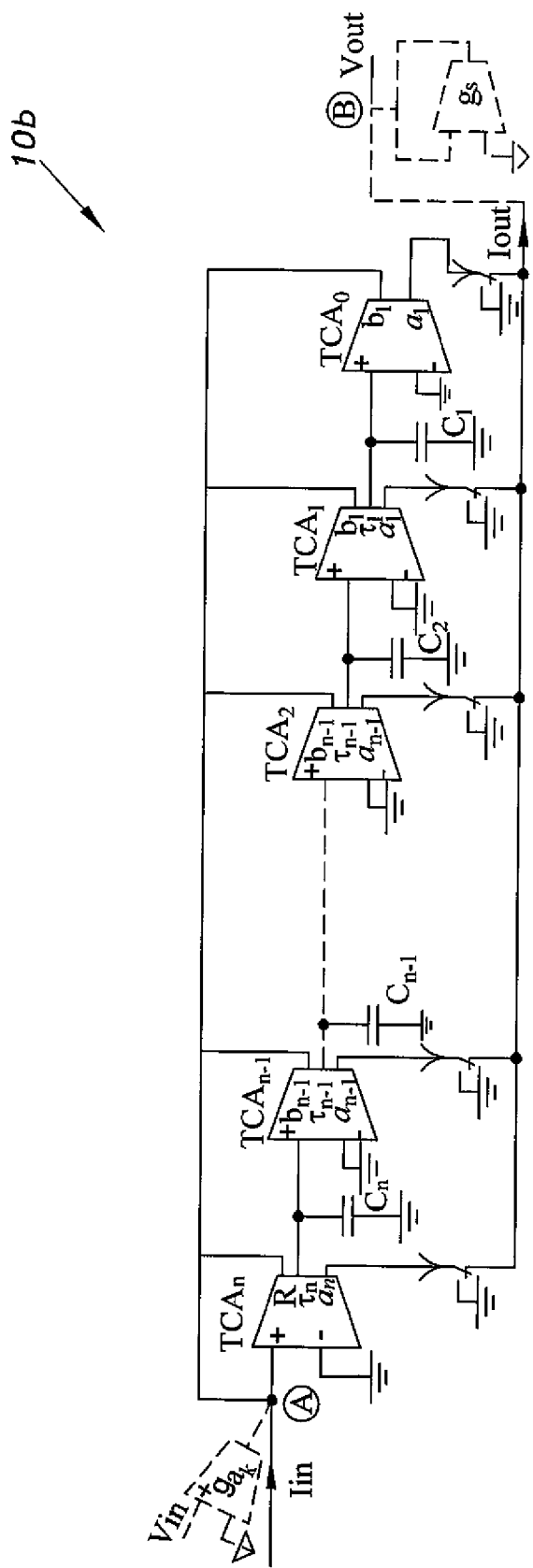
FIG. 4 is a schematic diagram of an FLF-SO filter based on multi-output TCAs.

On the other hand, it can be shown that utilizing a current-mode (CM) integrator based on a TCA results in a circuit without an s" output term. When, it is modified to provide an s" output, the circuit is identical to the filter 10a of FIG. 3. A single TCA can be utilized to efficiently develop the integrator such that the feedback factor and output signals can be realized using the same filter circuitry 10b, as shown in FIG. 4. Filter 10b employs a minimum number of devices (n+1) for the case of current-mode processing. However, TCAs having outputs with different gains are required to promote independent programmability features.

On the other hand, a voltage-mode integrator and feedback factors can be realized with a single device if it has both low output impedance and a virtual ground input terminal to facilitate the addition of the feedback signals. These two features are inherently available in the TRA. Without the virtual grounds, the voltage signals must be first changed to current (additional devices) to allow proper addition. Inverters in current mode could be realized in the internal design of devices where cross-coupled current mirrors are often incorporated. The TRA comprises a current follower at the input port and a voltage buffer at the output port. Its ideal terminal characteristic can be expressed as $V_X=0$, $I_Z=I_X$, $V_W=V_Z$.

Figure 5A:
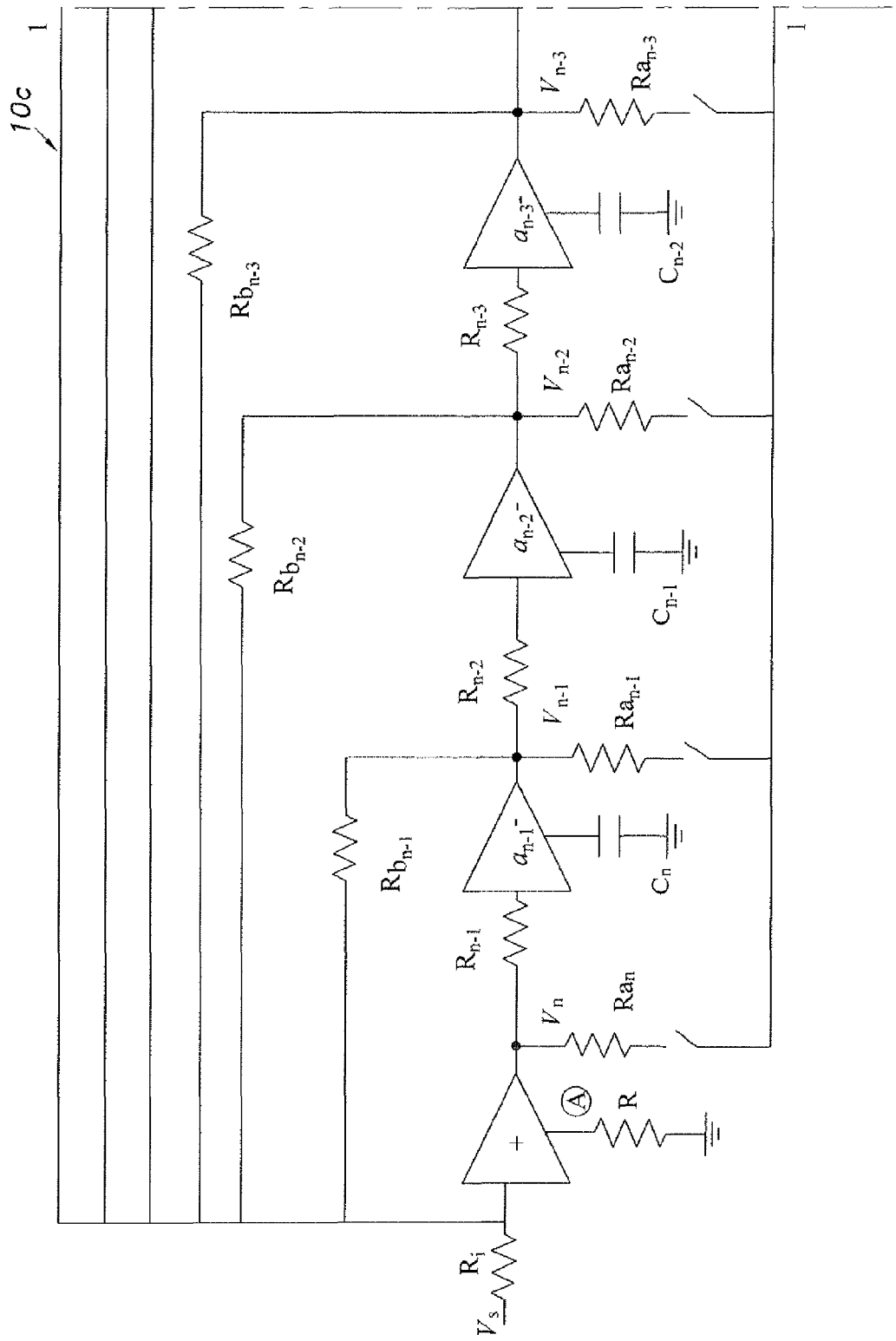
FIGS. 5A-5B is a schematic diagram showing a voltage-mode (VM) filter using FLF-SO based on single output TRAs.
Figure 5B:
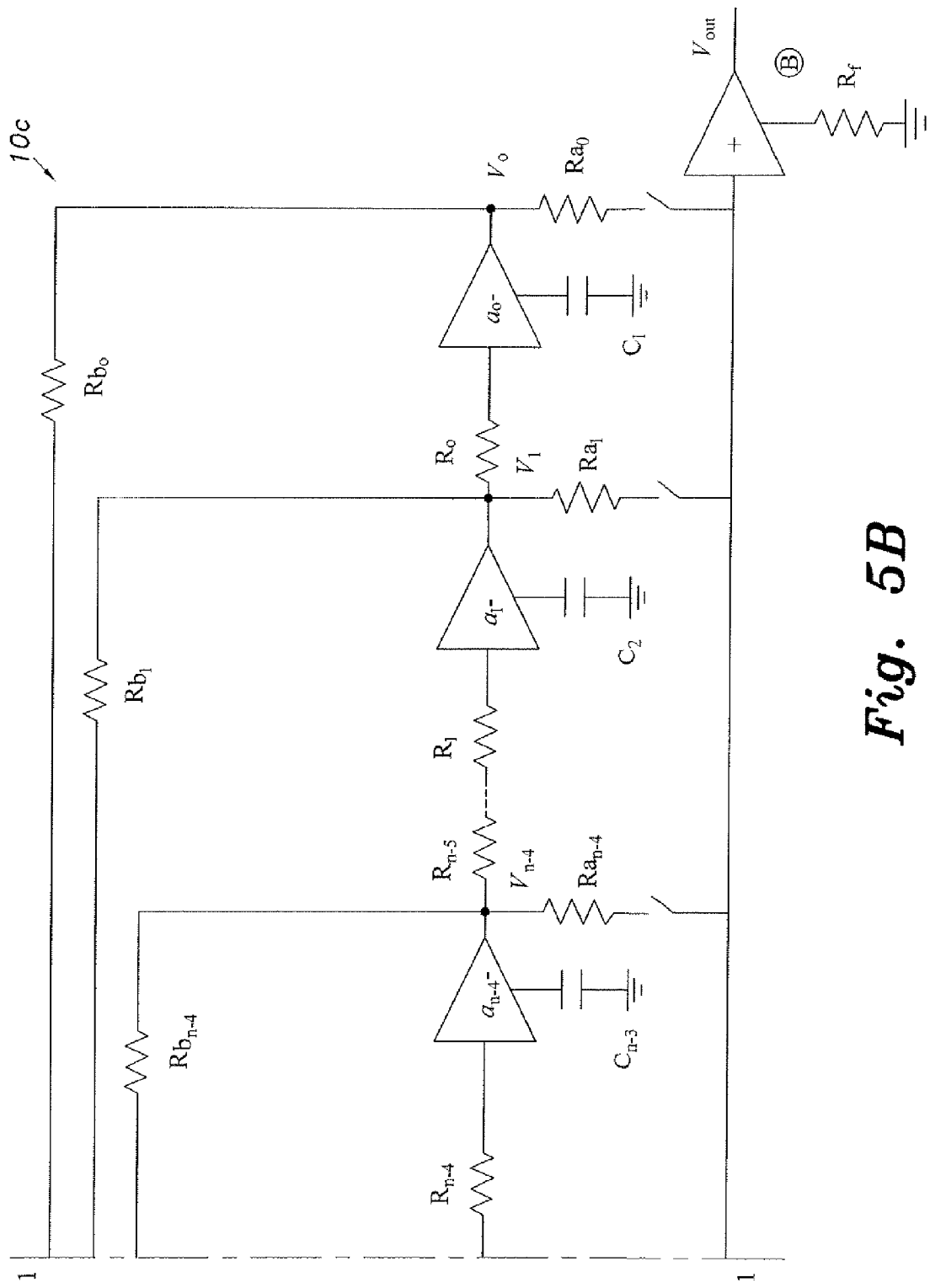
Figure 6:
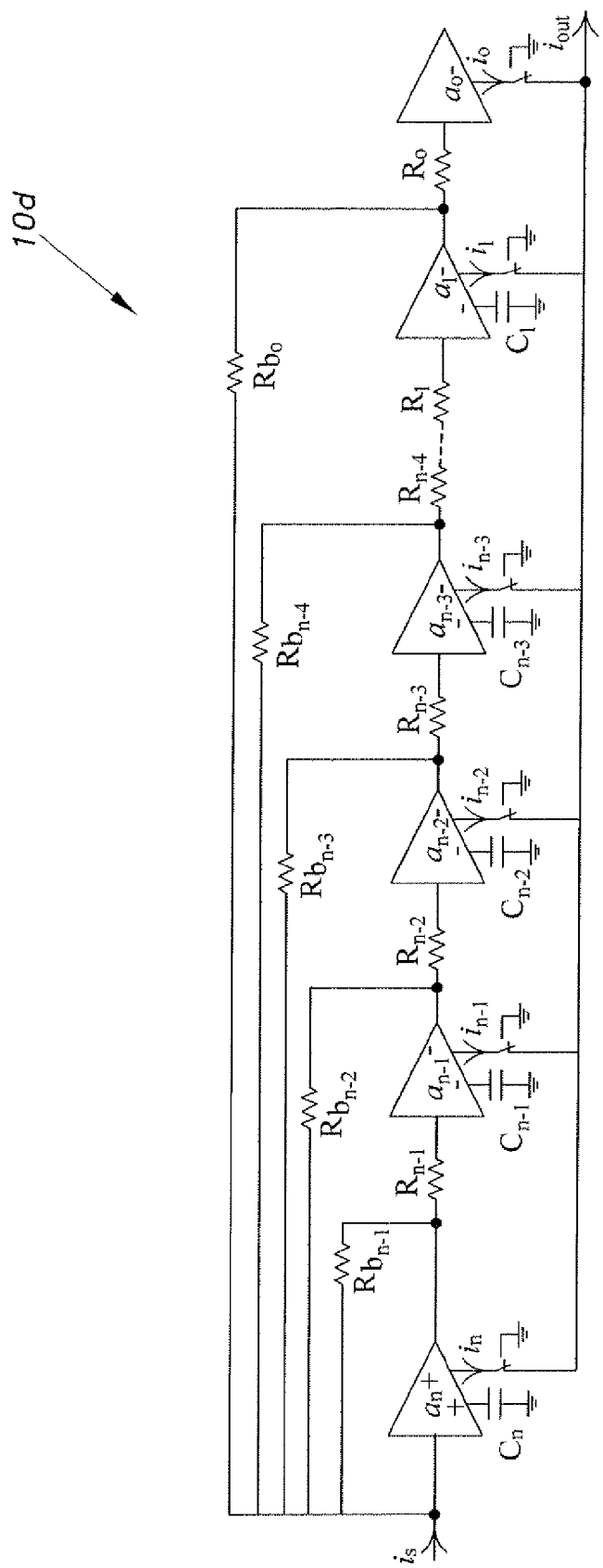
FIG. 6 is a schematic diagram showing a current-mode (CM) filter using FLF-SO based on dual output TRAs.
Figure 7:
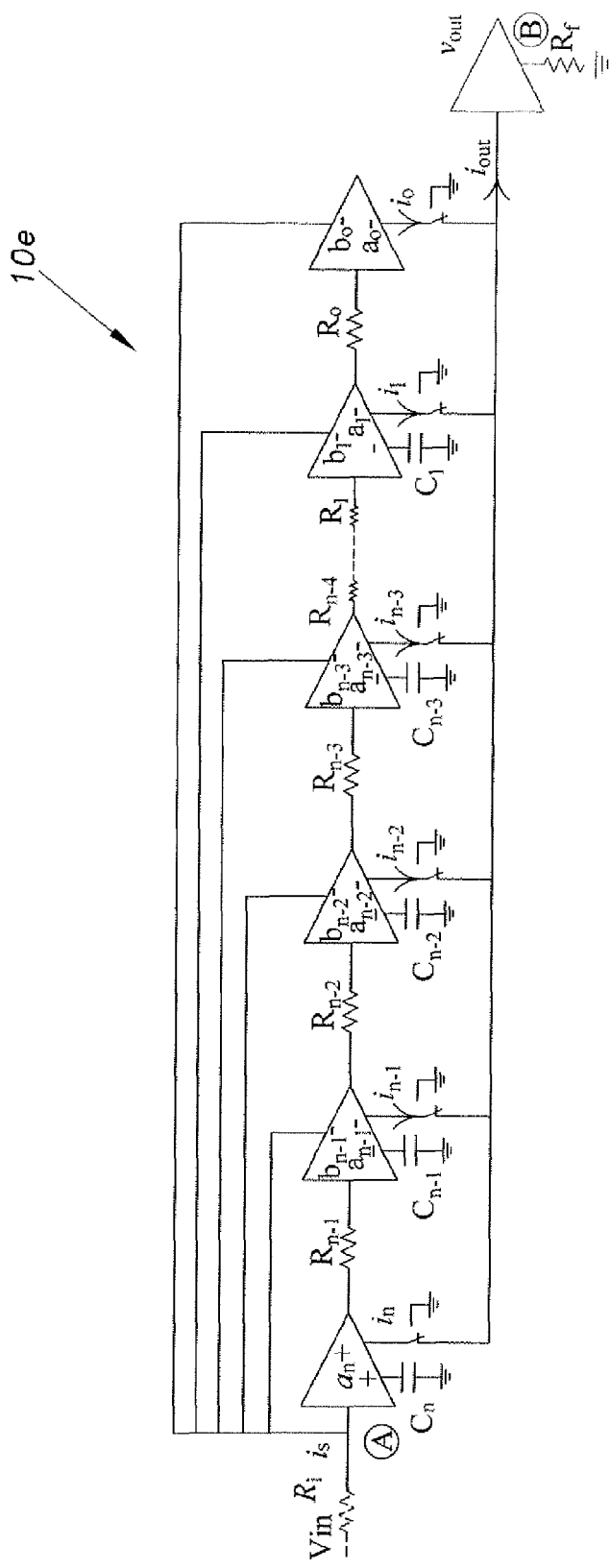
FIG. 7 is a schematic diagram showing a CM filter using FLF-SO based on multi-output TRAs.

As shown in FIGS. 5A-5B, a TRA-based integrator voltage-mode filter 10c employs n+2 amplifiers. Although the filter 10c has independent coefficients for both N(s) and D(s), electronic control of the filter parameters is not possible. To promote independent programmability of the TFs coefficients through the current gains of a TRA, n TRAs must be added in the feedback paths and n+1 TRAs must be added in the summing paths. The non-ideal impedances of the TRA can be modeled by input parasitic impedance at the input terminal ($Z_x$), output parasitic conductance at the high impedance output ($Y_z$), and output impedance at the low impedance output ($Z_w$). Since the TRA is designed to exhibit low input impedance and high output impedance, $Z_x$, $Y_z$ and $Z_w$ are dominated by series resistance ($r_x$) shunt capacitance ($C_z$), and series resistance ($r_w$), respectively. Therefore, it can be seen that the filter of FIGS. 5A-5B has unwanted poles at node A and B. With the help of dual-output devices, the filter can be slightly modified to provide a CM filter 10d that handles current-mode signals, as shown in FIG. 6. Filter 10d incorporates n+1 TRAs. However, 2n+1 additional IRAs are needed to allow independent electronic control of the filter coefficients. As shown in FIG. 7, an FLF-SO filter 10e utilizes TRAs with three outputs, which are employed to replace the resistors in the feedback paths.

Alternatively, the CA can be utilized to develop current-mode cascadable integrators. Unlike a current-mode integrator based on a TCA or a TRA, developing its counterpart based on a CA is more involved. Basically, there are two alternatives. The first option is through applying the input current at the X-terminal and connecting a shunt capacitor at the output terminal Z to perform integration. Then, the voltage of the capacitor ($V_c=I_x/sC$) is converted again to an output current using a voltage-to-current converter. A more efficient realization is obtained by converting the lossy current-mode passive integrator to a lossless cascadable topology with the help of a dual output CA. The input virtual ground of the CA is utilized to sense the current in the resistor, whereas the two outputs are utilized for converting the integrators from lossy to lossless cascading and feedback factors, respectively.

Figure 8:
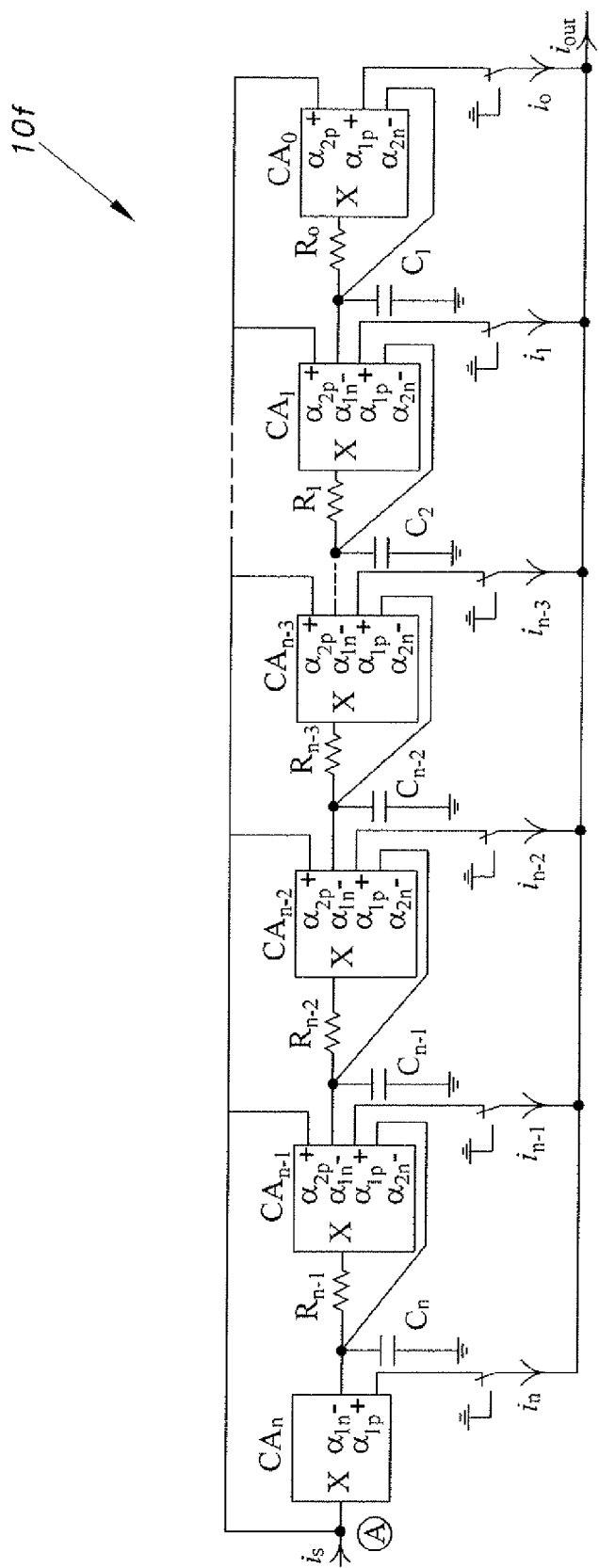
FIG. 8 is a schematic diagram showing a filter having an FLF-SO topology using multi-output CAs.

An exemplary FLF-SO filter 10f, shown in FIG. 8, incorporates n−1 CAs with 4 outputs, one CA with two outputs, and a CA with three outputs. This topology uses the minimum possible active devices while providing all terms of N(s). Note that the filter 10f would have dependent coefficients unless CAs having different gains are adopted.

The number of devices required to realize various SFG topologies based on the four different amplifier types is given in Tables I-III. The number of single output TCAs required to construct VM filters is 3n+4, which can be reduced to n+3 when adopting multi-outputs TCAs. However, it is found that VM filters based on single output TRAs require 3n+2 devices. In this regard, it is found that filters based on IFLF-SO and FLF-SO topologies obtained from FIGS. 5A-5B are more efficient than their counterparts of FIG. 4. Also, it is found that the number of devices is reduced to n+2 when multi-output TRAs are used to realize VM IFLF-SO and FLF-SO utilizing FIGS. 5A-5B. On the other hand, it can be shown that the minimum number of VAs is 3n+2 obtained from IFLF-DI topology. Clearly, a TRA is significantly more efficient than VAs. In fact, VA-based filters would inherently suffer from another serious problem due to the constant gain bandwidth product. Changing the gain of VAs in order to adjust the frequency response of the filter would be associated with undesired variations in the frequency characteristics due to the constant gain bandwidth product.

TABLE I

Number of amplifiers needed for IFLF-SO topology

| Devices | VM | CM |
|---|---|---|
| Single Output TCA | 3n + 4 | 3n + 2 |
| Multi-output TCAs | n + 3: | n + 1: |
|  | 1 with 3 o/p | 1 with 3 o/p |
|  | n − 1 with 2 o/p | n − 1 with 2 o/p |
|  | 2 with 1 o/p | 1 with n + 1 o/p |
| Single output TRA | 3n + 3 (FIG. 4) | 3n + 1 |
|  | 3n + 2 (FIGS. 5A-5B) |  |
| Multi-output TRA | n + 2: | n + 1: |
|  | n with 2 o/p | n with 2 o/p |
|  | 1 with n + 1 o/p | 1 with n + 1 o/p |
|  | 1 with 1 o/p |  |
| Multi-output CA | — | n + 1: |
|  |  | n − 1 with 3 o/p |
|  |  | 1 with n + 2 o/p |
|  |  | 1 with 2 o/p |
| VA | 3n + 3 | — |

TABLE II

Number of amplifiers needed for IFLF-DI topology

| Devices | VM | CM |
|---|---|---|
| Single Output TCA | 3n + 4 | 3n + 4 |
| Multi-output TCAs | n + 3: | n + 3: |
|  | 1 with 2 o/p | 1 with 2 o/p |
|  | n with 1 o/p | n with 1 o/p |
|  | 2 with n + 1 o/p | 2 with n + 1 o/p |

TABLE II-continued

Number of amplifiers needed for IFLF-DI topology

| Devices | VM | CM |
|---|---|---|
| Single output TRA | 3n + 2 | 3n + 4 |
| Multi-output TRA | n + 4:<br>n + 2 with 1 o/p<br>2 with n + 1 o/p | n + 5:<br>n + 3 with 1 o/p<br>2 with n + 1 o/p |
| Multi-output CA | — | n + 2:<br>1 with n + 1 o/p<br>1 with n + 2 o/p<br>n − 1 with 2 o/p<br>1 with 1 o/p |
| VA | 3n + 2 | — |

TABLE III

Number of amplifiers needed for FLF-SO topology

| Devices | VM | CM |
|---|---|---|
| Single Output TCA | 3n + 4 | 3n + 2 |
| Multi-output TCAs | n + 3:<br>n with 3 o/p<br>1 with 2 o/p<br>2 with 1 o/p | n + 1:<br>n with 3 o/p<br>1 with 2 o/p |
| Single output TRA | 3n + 3 (FIG. 4)<br>3n + 2 (FIGS. 5A-5B) | 3n + 1 |
| Multi-output TRA | n + 2:<br>2 with 2 o/p<br>n − 1 with 3 o/p<br>1 with 1 o/p | n + 1:<br>2 with 2 o/p<br>n − 1 with 3 o/p |
| Multi-output CA | — | n + 1:<br>n − 1 with 4 o/p<br>1 with 2 o/p<br>1 with 3 o/p |
| VA | 3n + 3 | — |

It can be seen from Tables I-III that the CM filters based on IFLF-SO and FLF-SO achieve a minimum number of devices (n+1) when adopting multi-output TCAs (as in FIG. 4), multi-output TRAs (as in FIG. 7), or multi-output CAs (as in FIG. 8). For the current-mode IFLF-DI topologies, the input signal ($I_{in}$) is first changed to voltage, then either n+1 single output TCAs and TRAs, or a TCA with n+1 are (is) used to inject the input, whereas, for a multi-output TRA and CA-based filters, an amplifier with n+1 output is required in each case.

At device level, multi-output TCAs, TRAs and CAs are optimum in realizing CM IFLF-SO and FLF-SO topologies. However, the power consumption of each device depends on its CMOS realization. Basically, the TRA often can be decomposed to a current follower (CF) or current amplifier (CA) followed by a voltage buffer (VB), whereas the TCA can be realized with a CCII with its X terminal loaded with a grounded resistor. A CCII (current conveyor) is no more than a VB (voltage buffer) whose output is sensed and conveyed to a high output impedance (high Z). A TCA obtained from a CCII is attractive because it provides better linearity than conventional TCA circuits, particularly for low supply voltages. Therefore, the TRA-based filters would use n+1 VBs and n+1 CFs more than their counterparts based on the CA and TCA (CCII), respectively. Thus, the most efficient designs are those obtained from the CA and CCII. A CCII-based filter 10g (shown in FIG. 9) is developed from its counterpart of FIG. 4. The CCII-based filter 10g has an associated pole that is proportional to $1/r_{xn}$ where $r_x$ is a parasitic resistance (ideally zero). Thus, $r_x$ can be made arbitrarily small to enhance high frequency performance.

The non-ideal AC response of the filter 10f FIG. 8 can be found by considering the non-ideal effects of the CAs dominated by series resistance ($r_x$) and shunt capacitance ($C_z$). Similar to the CCII-based filter 10g, the multi-output CA filter 10f has a pole at node A that is inherently at relatively high frequency. There are no other parasitic poles, as the effects of other $C_z$ can be absorbed, since they are in parallel with the passive capacitances. Also, $r_x$ for $CA_0$ through $CA_{n-1}$ is in series with the passive resistors, and therefore their values can be absorbed. However, the filter 10f has the disadvantage of using an extra local feedback for each integrator, which could result in deviations from the ideal response.

These gains can be precisely set to unity in simulation, but will manifest themselves in practice due to transistor mismatches. Referring to FIG. 8, the following current transfer gain notation is adopted for the various CAs: (1) the current gain of the negative output used for forward connection and input is denoted $\alpha_{1N}$, (2) the current gain of the negative output used for feedback and input is denoted $\alpha_{2N}$ and error terms are defined as $\epsilon_i = 1 - \alpha_{2Ni}$ (where $|\epsilon_i| \ll 1$), (3) the current gain of the positive output used to provide the output signal and input is denoted $\alpha_{1p}$, and (4) the current gain of the positive output used for feedback and input is denoted $\alpha_{2p}$. Therefore, it can be shown that non-ideal analysis will lead to:

$$\frac{i_o}{i_s} = \alpha_{1P0} \frac{\prod_{i=1}^{n} \alpha_{1Nn}}{D(s)} \tag{8a}$$

$$\frac{i_m}{i_s} = \alpha_{1Pm} \left( \prod_{j=1+m}^{n} \alpha_{1Nj} \right) \frac{\prod_{i=0}^{m-1} (sC_{i+1}R_i + \varepsilon_i)}{D(s)} \text{ for } m = 1 \text{ to } n-1 \tag{8b}$$

$$\frac{i_n}{i_s} = \alpha_{1Pn} \frac{\prod_{i=0}^{n-1} (sC_{i+1}R_i + \varepsilon_i)}{D(s)} \tag{8c}$$

where D(s) is given by equation (9), shown below:

$$D(s) = \alpha_{2P0} \prod_{i=1}^{n-1} \alpha_{1N} + \alpha_{2P1} \left( \prod_{i=2}^{n-1} \alpha_{1N} \right)(sC_1R_0 + \varepsilon_0) + \tag{9}$$

$$\alpha_{2P2} \left( \prod_{i=3}^{n-1} \alpha_{1N} \right) \prod_{i=0}^{n-3} (sC_{i+1}R_i + \varepsilon_i) + \cdots +$$

$$\prod_{i=0}^{n-2} (sC_{i+1}R_i + \varepsilon_i) + sC_nR_{n-1} \prod_{i=0}^{n-2} (sC_{i+1}R_i + \varepsilon_i)$$

Thus, it can be seen that various errors in the current gains result in deviations in the coefficients of D(s), and without changing the order of the filter. Similarly, it can be seen that various errors in $\epsilon_i$ will lead to some deviations in the denominator's coefficients without introducing any new pole. These deviations can be compensated by adjusting the passive resistor and/or capacitor values. However, the main problem comes from the error terms due to $\epsilon_i$ appearing in the numerator of various outputs. These errors cannot be compensated as they result in deviations from the ideal responses.

Figure 10:
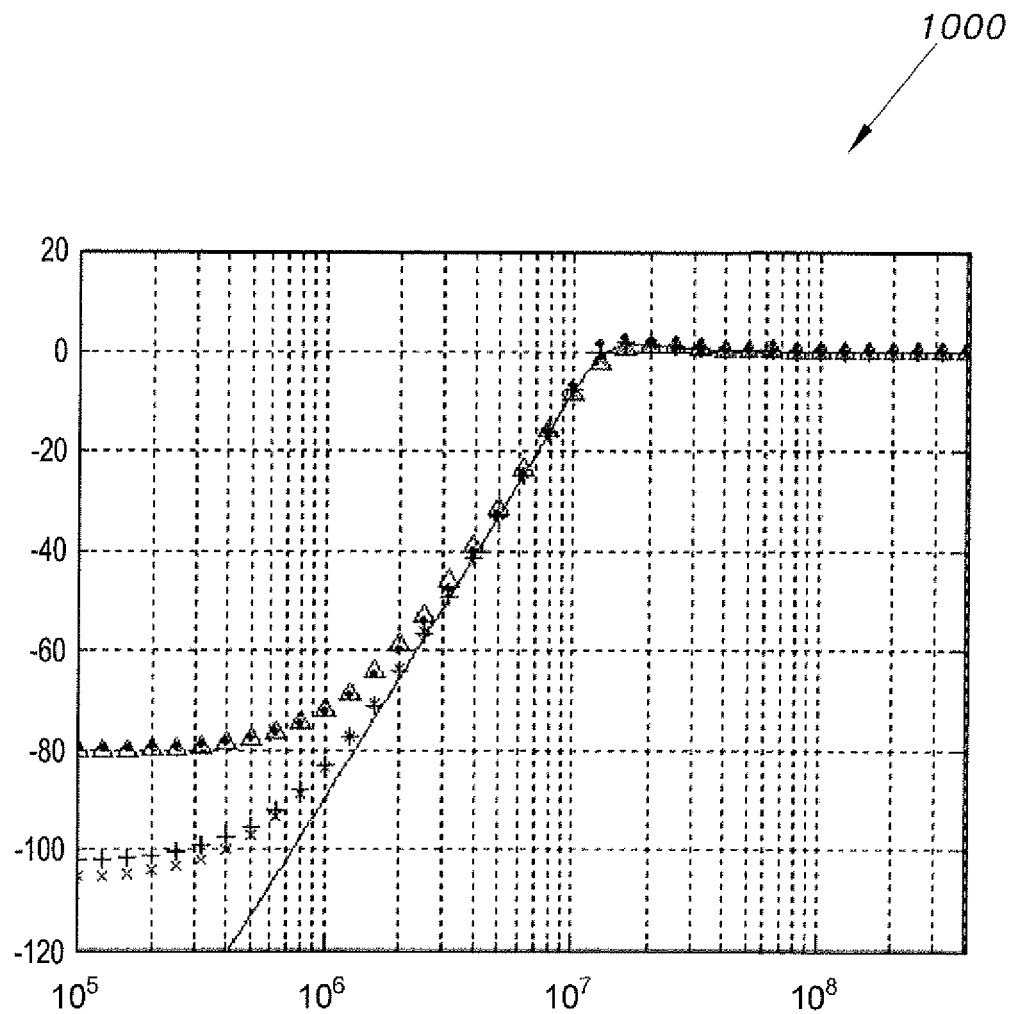
FIG. 10 is a Frequency v. Gain plot showing the effect of error in current gain on high-pass responses.
Figure 11:
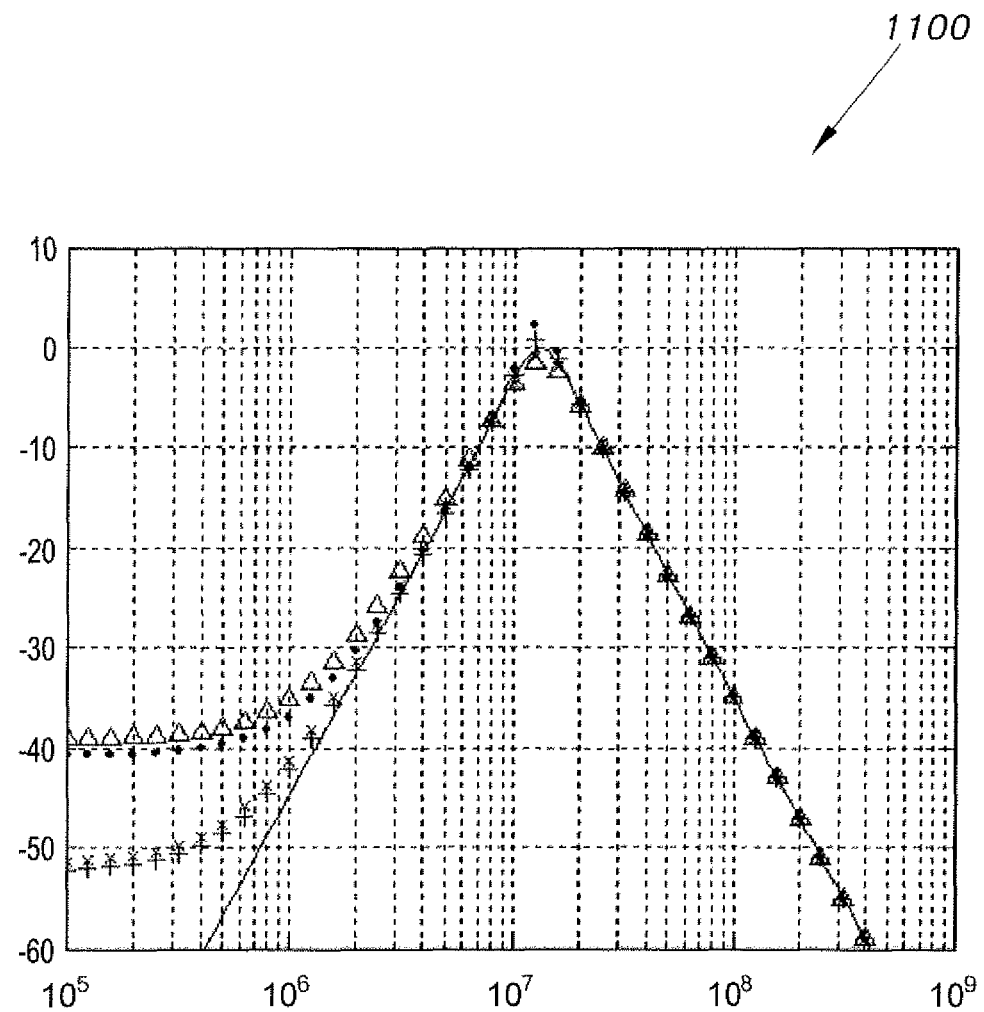
FIG. 11 is a bandpass plot showing the effect of error in current gain on bandpass response.

Although these errors cannot be remedied, they are found to result in small deviations in low frequency bands. The non-ideal high pass response plot 1000, shown in FIG. 10, is for ±10% and ±5% error in value of $\alpha_{2Ni}$, corresponding to $\epsilon_i = -0.1, 0.1, -0.05$ and $0.05$. All passive resistors are selected as 12 kΩ, and passive capacitors are chosen as 1 pF. It can be seen that as the error in $\alpha_{2Ni}$ increases, the stop band attenuation of the high pass filter is degraded. Also, the non-ideal band pass plot 1100, shown in FIG. 11, illustrates responses detailing the effects of $\epsilon_i$. It can be seen from equation (8a) that errors in $\epsilon_i$ do not affect the stop band attenuation of the lowpass filter. In practice, the stop band attenuation is usually limited by noise floor and/or non-ideal grounding to values in these ranges.

Figure 9:
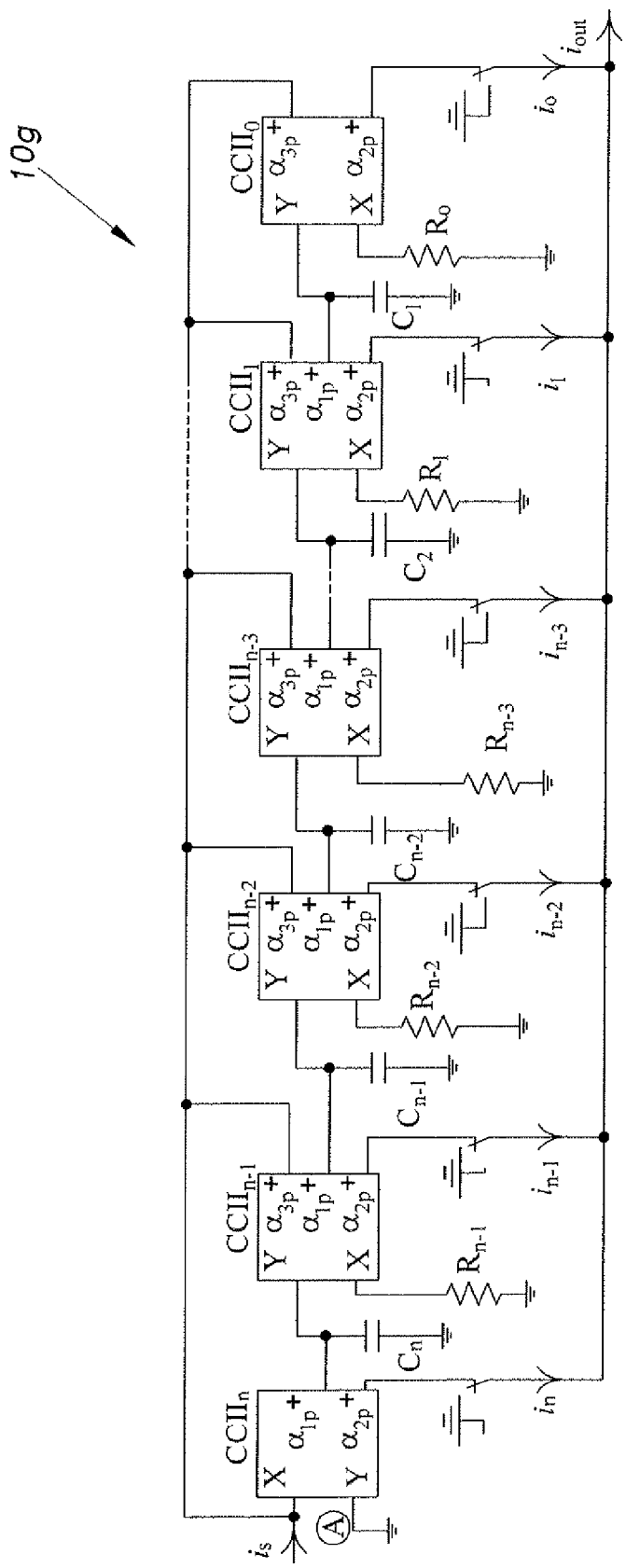
FIG. 9 is a schematic diagram showing a filter having an FLF-SO topology that uses CCIIs (current conveyors).

On the other hand, the filter of FIG. 9 does not suffer from the non-idealities associated with the CA. But, it exhibits limited signal swing because of the use of a voltage follower to implement the Y-X characteristic denoted by ($|V_{YB}|$), especially when operated from low supply voltages. Current signals are restricted by the linear region of the $I_Z$-$I_X$ characteristic designated by ($|I_{CF}|$). It can be shown that the filters based on a CA and a CCII exhibit same signal swing when $R<\alpha_{max}|V_{YB}/I_{CF}|$, where $\alpha_{max}$ is the maximum current gain of the various CAs. For example, when $\alpha_{max}$ is unity, $|V_{YB}|$=1V (typical value for a supply voltage of 1.8V), and $|I_{CF}|$=1 mA (typical value obtained from class-AB output stages), R must be selected to be less than 1 kΩ. This small resistance would require relatively large capacitances that might not be practically suitable for IC implementation. For example, a filter with a pole frequency of 1 MHz would require capacitors of approximately 160 pF.

The remaining issue in the design of filters 10*f* and 10*g* is introducing the tuning feature to permit adjusting the filter coefficients. It is possible to change active-RC filters based on the CCII and CA to their active-C counterparts utilizing a CCCII (second generation current-controlled current conveyor). In this case, the passive resistors would be replaced by the internal resistance of the X terminals of the CCCII. A CCCII uses adjustable biasing current to vary the parasitic resistance ($r_x$) of the CCII's X-terminal. But $r_x$ is inherently nonlinear, which limits the linearity of the CCCII. Also, the CCCII is often implemented in bipolar junction transistor (BJT) technology, which is more expensive, and hence less attractive for IC applications. In fact, a CCCII realized in BJT technology has an additional disadvantage, since its $r_x$ is temperature dependent. In addition, this approach is associated with limited tuning features, since $r_x$ can only be varied over small range.

Figure 12:
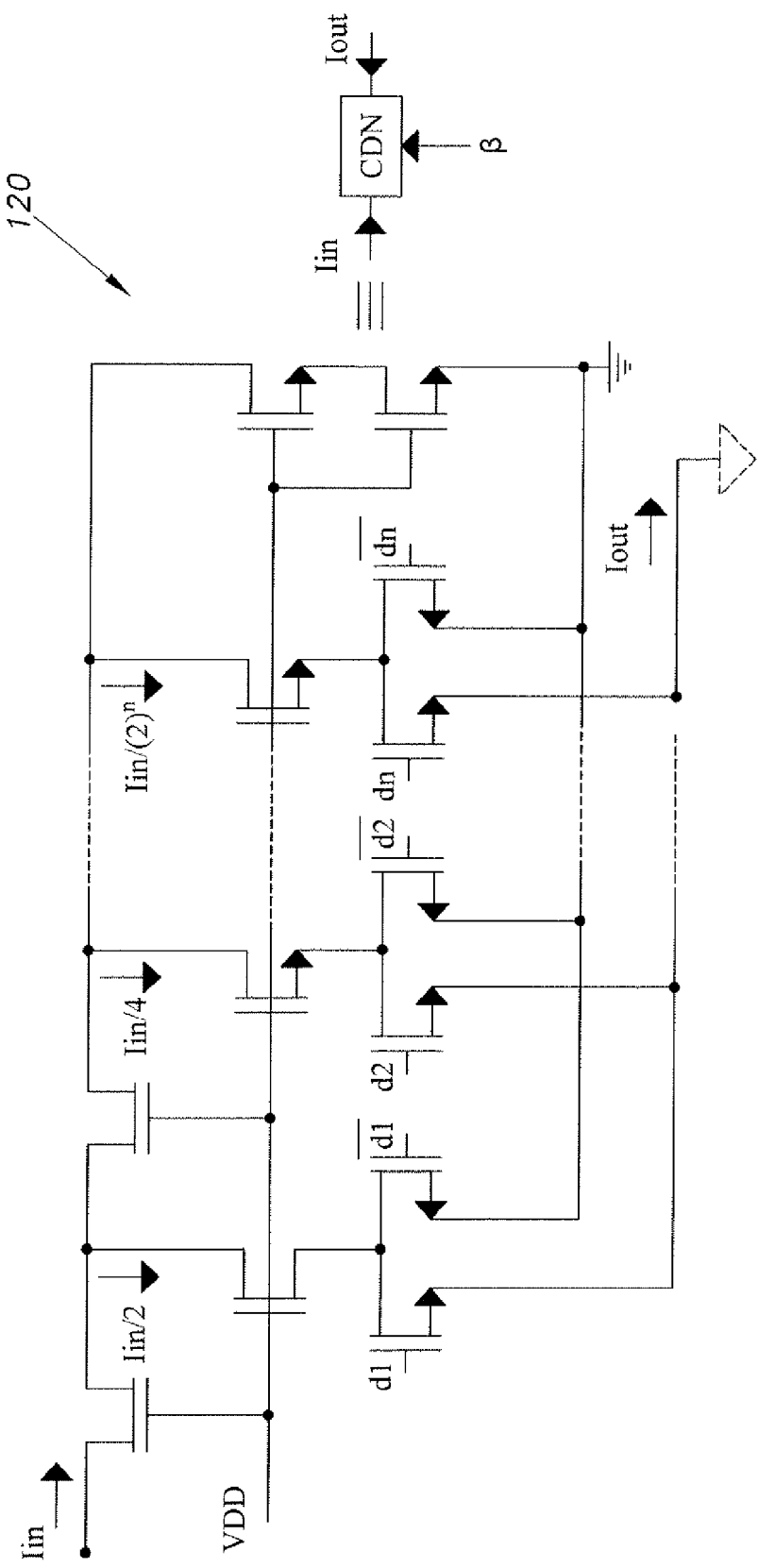
FIG. 12 is a schematic diagram of a CDN circuit.

Alternatively, a current amplifier can be injected in the design of the CCII to form an ECCII (electronically tunable current conveyor). In these topologies, the output current of the CCII ($i_x$) is sensed and then applied to the input of a current amplifier. The current amplifier amplifies $i_x$ and makes it available from a high output terminal Z. However, the operation of the current amplifier is often valid for small signals, limiting the linearity and tuning range. On the other hand, a digital tuning property provides wide tuning ranges and allows direct interfacing with the digital signal processing (DSP) part, available in most modern systems. Arrays of resistors and/or capacitors can be employed to offer the programmability feature. However, they occupy a relatively large silicon area. Alternatively, the digital tuning feature may be introduced through the adoption of highly linear devices, such as the current division network (CDN). An exemplary CDN 120 has a simple structure, as shown in FIG. 12. The CDN 120 is inherently linear because its operation is insensitive to second-order effects and valid in all MOS operating regions.

Figure 13:
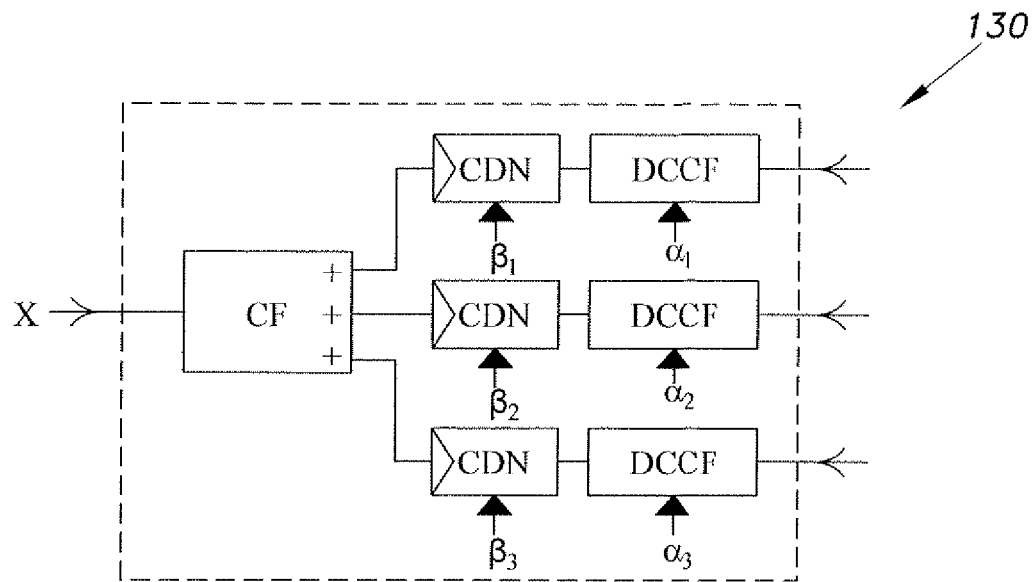
FIG. 13 is a block diagram of an MDCCA with different gains.

The input current is binary-weighted through the different branches. Therefore, the output current can be expressed as:

$$I_{out}=I_{in}\Sigma_{i=1}^{n}d_i 2^{-i}=\beta I_{in} \tag{10}$$

where $d_i$ is the i-th digital bit, n is the size of control word and $\beta=\Sigma_{i-1}^{n}d_i 2^{-1}$. The CDN is suitable for low power operation, since it does not dissipate standby current. However, the proper operation of the CDN requires the input node to be current-driven, while the output node must be virtually grounded. A DCCF with single- or multi-outputs can be developed through utilizing a CDN in the design of a current follower to form a digitally controlled current amplifier (DCCF). The transfer current characteristic of the DCCF is given by:

$$I_Z=1/\Sigma_{j=1}^{m}a_j 2^{-j}I_X=\alpha I_X \tag{11}$$

where $a_j$ is the j-th digital bit, and m is the size of the control word. However, the proposed filter 10*f* requires CAs with different gains. An exemplary multi-output DCCA (MDCCA) 130 having independent gains is shown in FIG. 13. Although it seems that this topology is power inefficient, it enjoys an extremely wide tuning range. This is because DCCAs provide current gains ($\alpha$), whereas the external CDNs are utilized to provide attenuations ($\beta$). In filter design, current gains can scale up the frequency characteristics, whereas attenuations can be used for frequency scale down.

Figure 14:
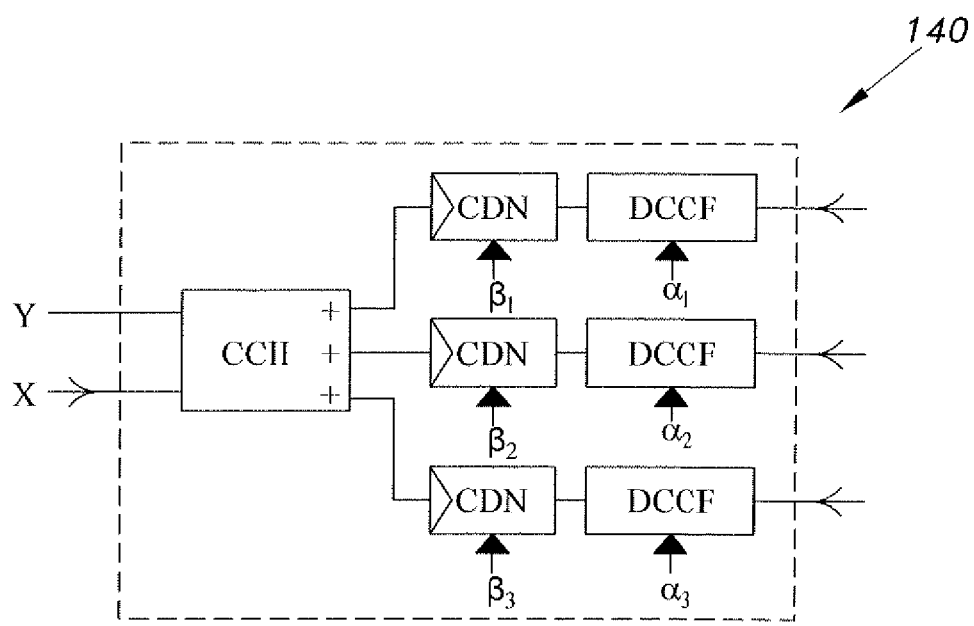
FIG. 14 is a block diagram of an MDCCII with different gains.

The MDCCA 130 can be used to replace the CA in filter 10*f* to achieve independent control of the filter coefficients. Note that the gain of the outputs adopted in the forward path of the integrators is set to unity. This means that the total number of CF becomes 3n+2. Similarly, filters based on CCIIs can be made electronically programmable utilizing multi-output digitally controlled CCIIs (MDCCCII) 140, as shown in FIG. 14.

Note that the gain of the outputs adopted in the forward path of the cascade integrators is set to unity. Therefore, the filter 10*g* of FIG. 9 has MDCCCII 140 with three outputs that comprise a CCII and two DCCAs. This means that 2n+1 DCCFs will be needed, in addition to the n+1 CCII. Clearly the use of multi-output devices, such as MDCCA and MDCCCII, allows the achievement of wide tuning ranges. However, they are less attractive because of their high power consumption.

Figure 15A:
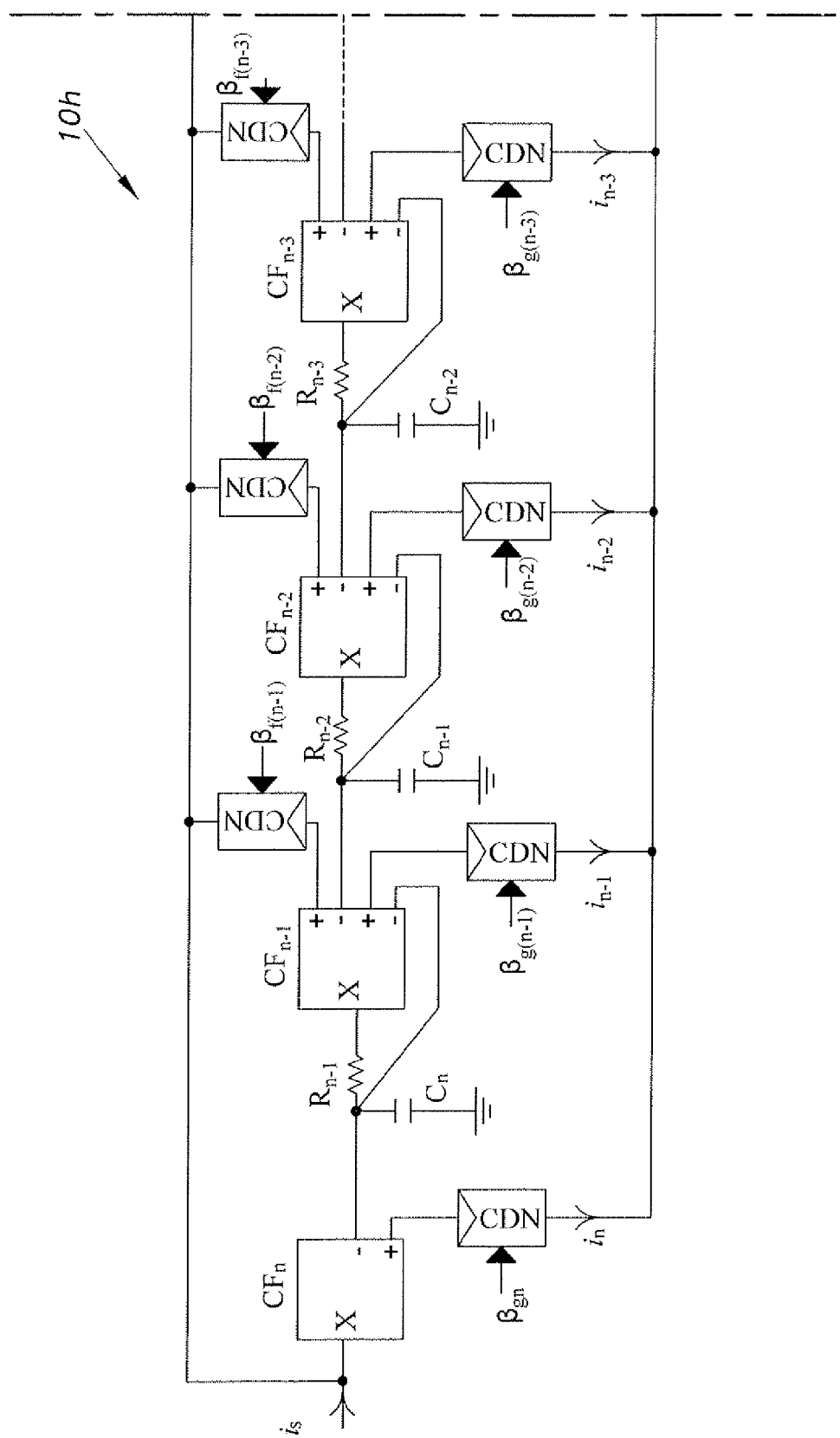
FIGS. 15A-15B is a schematic diagram showing a reconfigurable high-order integrated circuit filter according to the present invention similar to FIG. 8, but having programmable coefficients by using external CDNs.
Figure 15B:
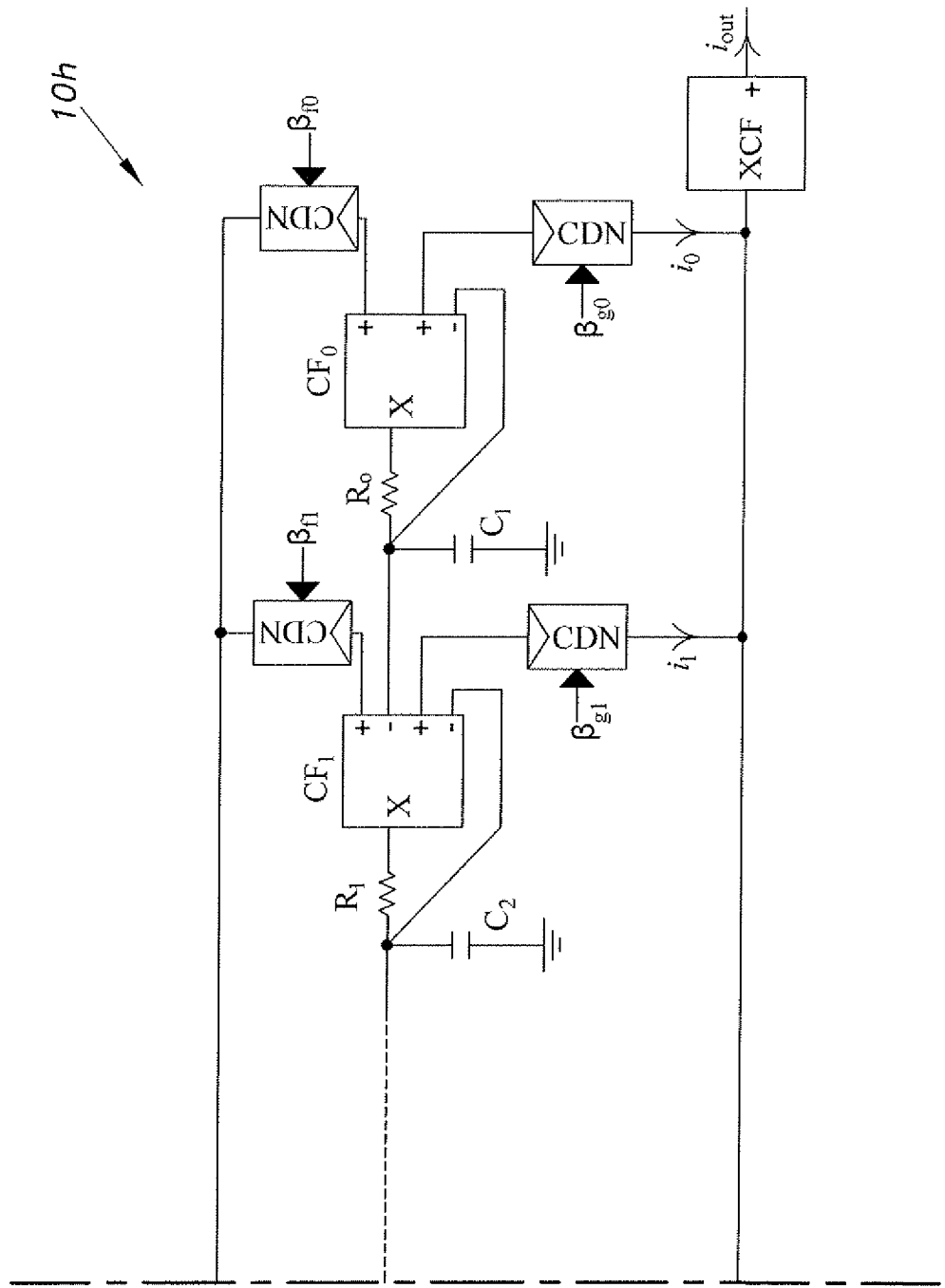

This problem is circumvented through the adoption of CDNs outside the active devices. This is possible because the input resistance of the filters of FIG. 8 and FIG. 9 are at virtual ground for FLF structures, and hence CDNs can be inserted in series with feedback paths (for denominator coefficients tuning). Similarly, CDNs can be also inserted in series with the various output currents and in the forward paths (for numerator coefficients tuning), wherein an additional CF is inserted for proper operation in filters 10*h* and 10*i*, as shown in FIGS. 15A-15B and FIGS. 16A-16B, respectively. It will be understood that the current followers (CFs) in FIG. 15A-15B are current amplifiers (CAs) with unity gain.

The transfer functions of the filters 10*h* and 10*i* can be expressed as:

$$\frac{i_m(s)}{i_s(s)}=\frac{s^m \beta_{gm}\prod_{i=m}^{n-1}\frac{1}{C_{i+1}R_i}}{s^n+\sum_{i=0}^{n-1}\beta_{fi}s^i\prod_{j=i}^{n-1}\frac{1}{C_{j+1}R_j}} \tag{12a}$$

for $m=0$ to $n-1$

-continued $$\frac{i_n(s)}{i_s(s)} = \frac{s^n \beta_{gn}}{s^n + \sum_{i=0}^{n-1} \beta_{fi} s^i \prod_{j=i}^{n-1} \frac{1}{C_{j+1} R_j}}. \quad (12b)$$

It can be seen that filters 10h (shown in FIGS. 15A-15B) and 10i (shown in FIGS. 16A-16B) provide independent tuning of both numerator and denominator coefficients. Each of the numerator coefficients can be independently tuned by varying parameters $\beta_{g0}$ to $\beta_{gn}$. The coefficients of the denominator can be independently adjusted by varying $\beta_{f0}$ through $\beta_{fn-1}$. The filters 10h and 10i can be reconfigured without the need of switches, since the CDNs can be utilized to set the undesired output current to zero. Hence, analog switches in the signal path are avoided. The switching transistors (quasi-static switches) in the signal paths are associated with finite non-linear resistances. Also, analog switching employed for signal routing limits the overall high frequency operation. CDNs can be also adopted in the TRA-based filter of FIG. 7. However, this technique cannot be utilized in the design of op-amp based filters, since they do not have a current terminal to properly drive the CDN.

Filters 10h and 10i have been fabricated in a 0.18 μm N-well CMOS process. The active elements (the CF and CCII) were realized using known DCCF and VB circuits.

Equal resistors ($R_0=R_1=R_2=R_3$) of 12 kΩ and equal capacitors ($C_0=C_1=C_2=C_3$) of 1 pF are used. Throughout testing, the supply voltages were set to ±0.9V and the currents of the CF and CCII were $I_B$=20 μA and $I_{SB}$=5 μA. With an 8-bit CDN, β can be adjusted from 0 to 0.9961 with a resolution of 0.00391 in 255 steps. Two examples are given to demonstrate the flexible programmability features of the proposed filters. First, the filter of FIG. 15A-15B is designed to realize a 4th-order low pass Butterworth response with a passband frequency of 5 MHz and a gain of 12 dB. CDNs are programmed to promote changes in the passpand frequency down to 3.2 MHz while preserving the Butterworth response and gain. Also, CDNs are further programmed to allow modifying the filter coefficients in order to realize Chebyshev responses with a passband frequency of 5 MHz. Then, the CDNs are used to tune the filter passband to 10 MHz. Table IV shows the required theoretical values of different β's and the closest available digital word for the four cases.

TABLE IV

Values of βs of filter in FIG. 15A-15B

| Filter Type | $\beta_0$ | $\beta_1$ | $\beta_2$ | $\beta_3$ | $\beta_{g0}$ |
|---|---|---|---|---|---|
| BT (5 MHz) | 0.0202 | 0.140 | 0.485 | 0.985 | 0.081 |
| Closest | 0.0195 | 0.141 | 0.485 | 0.985 | 0.082 |
| Digital | 00000001 | 00100100 | 01111100 | 11111100 | 00010101 |
| BT (3 MHz) | 0.0036 | 0.042 | 0.216 | 0.657 | 0.0144 |
| Closest | 0.0039 | 0.043 | 0.215 | 0.656 | 0.0156 |
| Digital | 00000001 | 00000011 | 00110110 | 10101000 | 00000100 |
| CB (5 MHz) | 0.0036 | 0.0217 | 0.166 | 0.219 | 0.0144 |
| Closest | 0.0039 | 0.0234 | 0.168 | 0.219 | 0.0156 |
| Digital | 00000001 | 00000110 | 00101011 | 00111000 | 00000100 |
| CB (10 MHz) | 0.0572 | 0.1735 | 0.6646 | 0.4385 | 0.2190 |
| Closest | 0.0547 | 0.1758 | 0.6641 | 0.4375 | 0.2188 |
| Digital | 00001110 | 00101101 | 10101010 | 01110000 | 00111000 |

Figure 17:
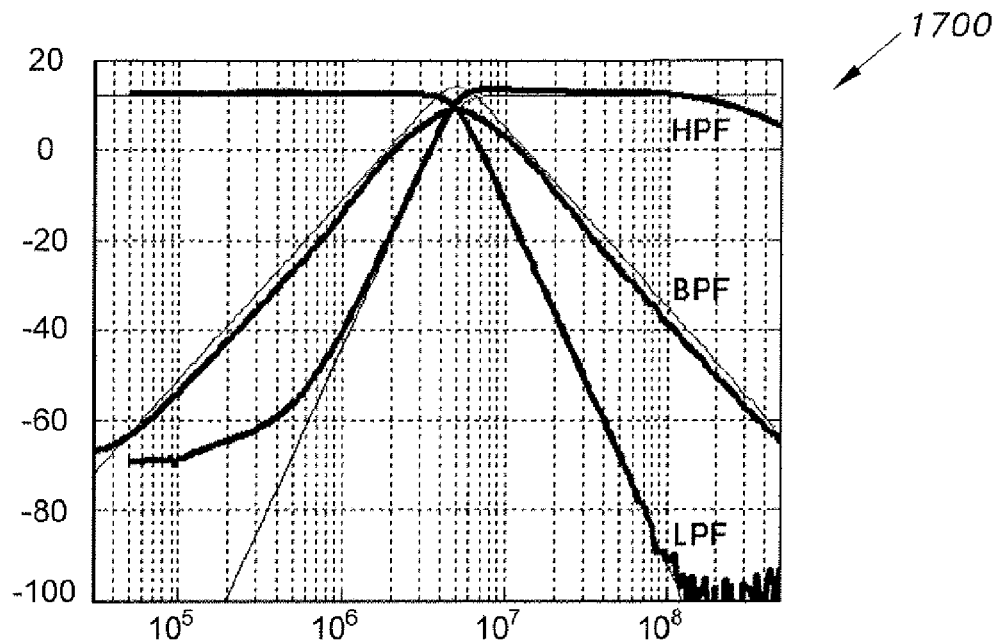
FIG. 17 is a plot of gain vs. frequency, showing the response of the filter of FIGS. 15A-15B configured as a low pass Butterworth filter with a pole frequency at 5 MHz, together with the filter reconfigured for bandpass and high pass responses.
Figure 18:
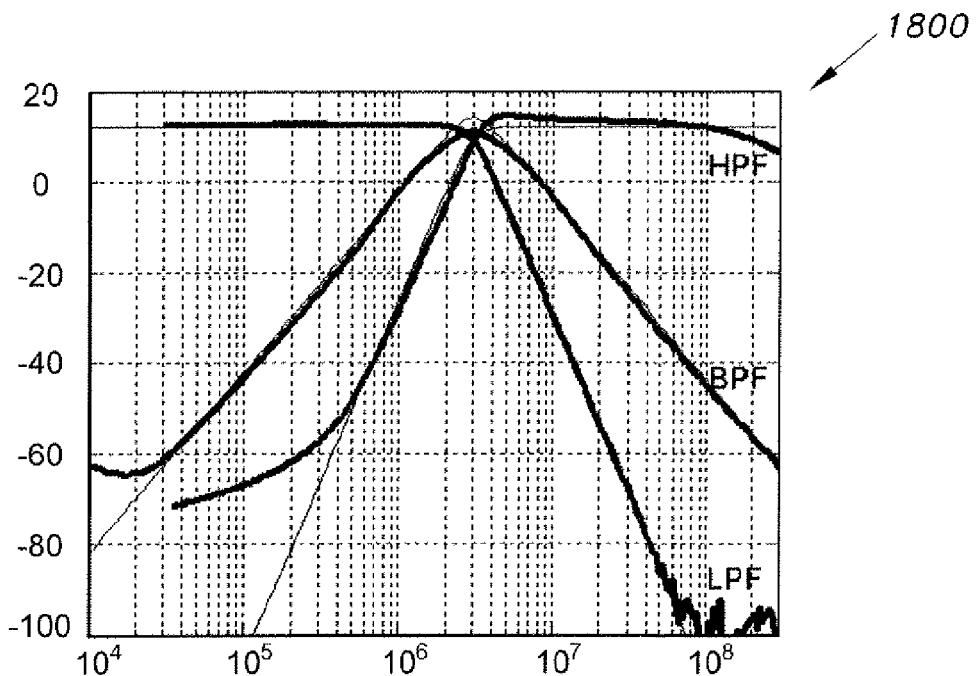
FIG. 18 is a plot of gain vs. frequency, showing the response of the filter of FIGS. 15A-15B configured as a low pass Butterworth filter with a pole frequency at 3 MHz, together with the filter reconfigured for bandpass and high pass responses.
Figure 19:
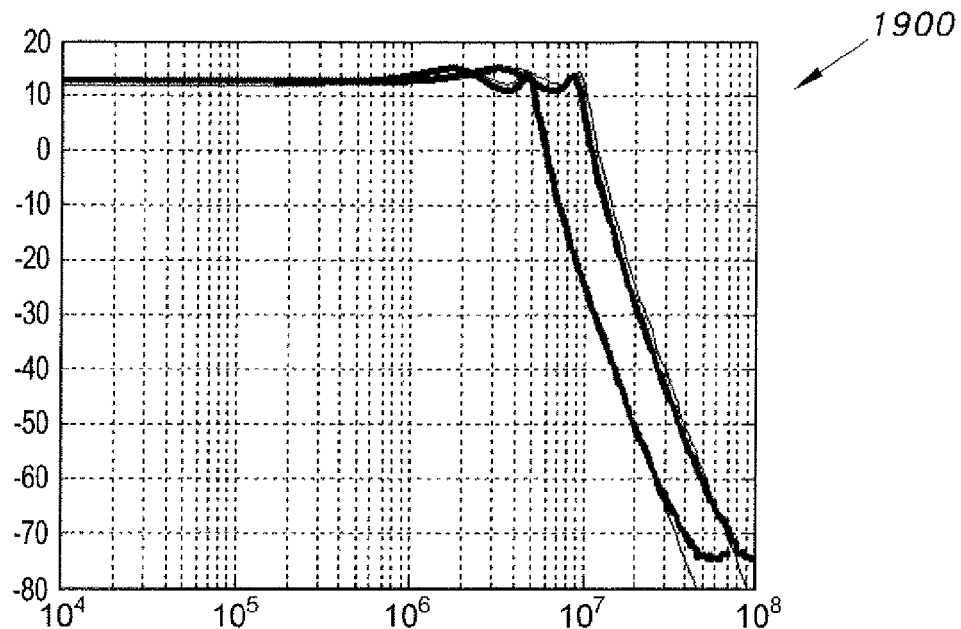
FIG. 19 is a plot of gain vs. frequency, showing the response of the filter of FIGS. 15A-15B configured as a Chebyshev filter.
Figure 20:
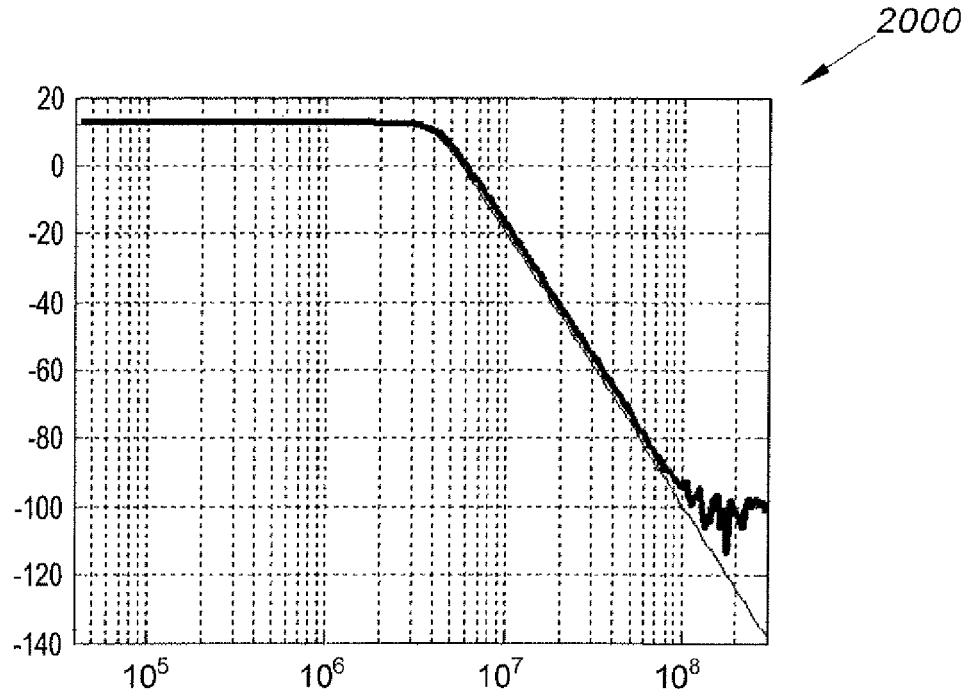
FIG. 20 is a plot of gain vs. frequency, showing the response of the filter of FIGS. 16A-16B configured as a low pass Butterworth filter with a pole frequency at 4 MHz.

Plot 1700 details measured lowpass Butterworth response with pole frequency of 5 MHz, as shown in FIG. 17. The filter was reconfigured to realize bandpass and highpass responses, which are also shown in FIG. 17. Plot 1800 details experimental results demonstrating pole frequency adjustments, as shown in FIG. 18. Plot 1900 shows Chebyshev responses obtained from the same filter, as shown in FIG. 19.

Figure 16A:
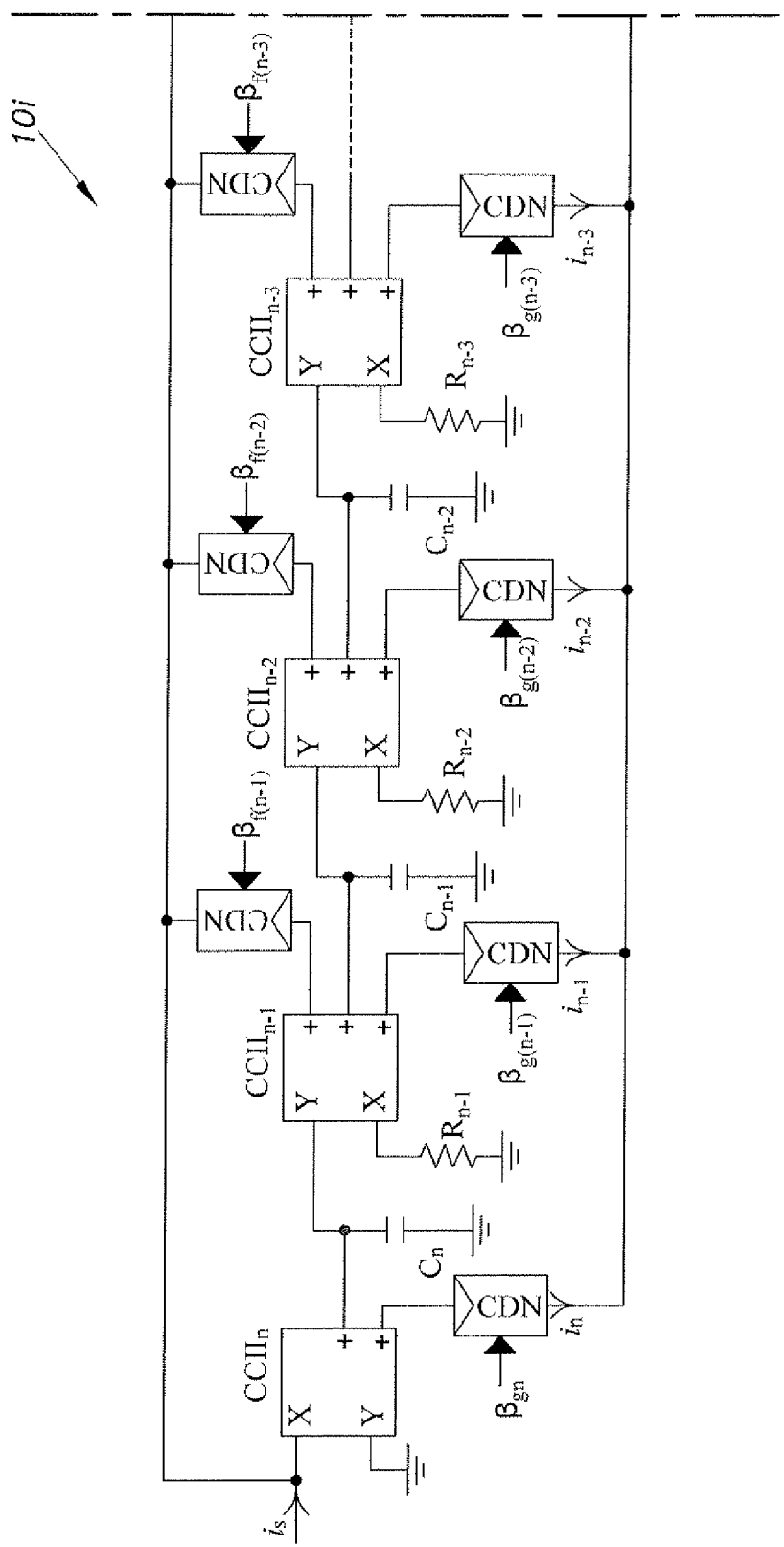
FIGS. 16A-16B is a schematic diagram of a reconfigurable high-order integrated circuit filter according to the present invention similar to FIG. 9, but having programmable coefficients by using an external CDN and an internal CCII.
Figure 16B:
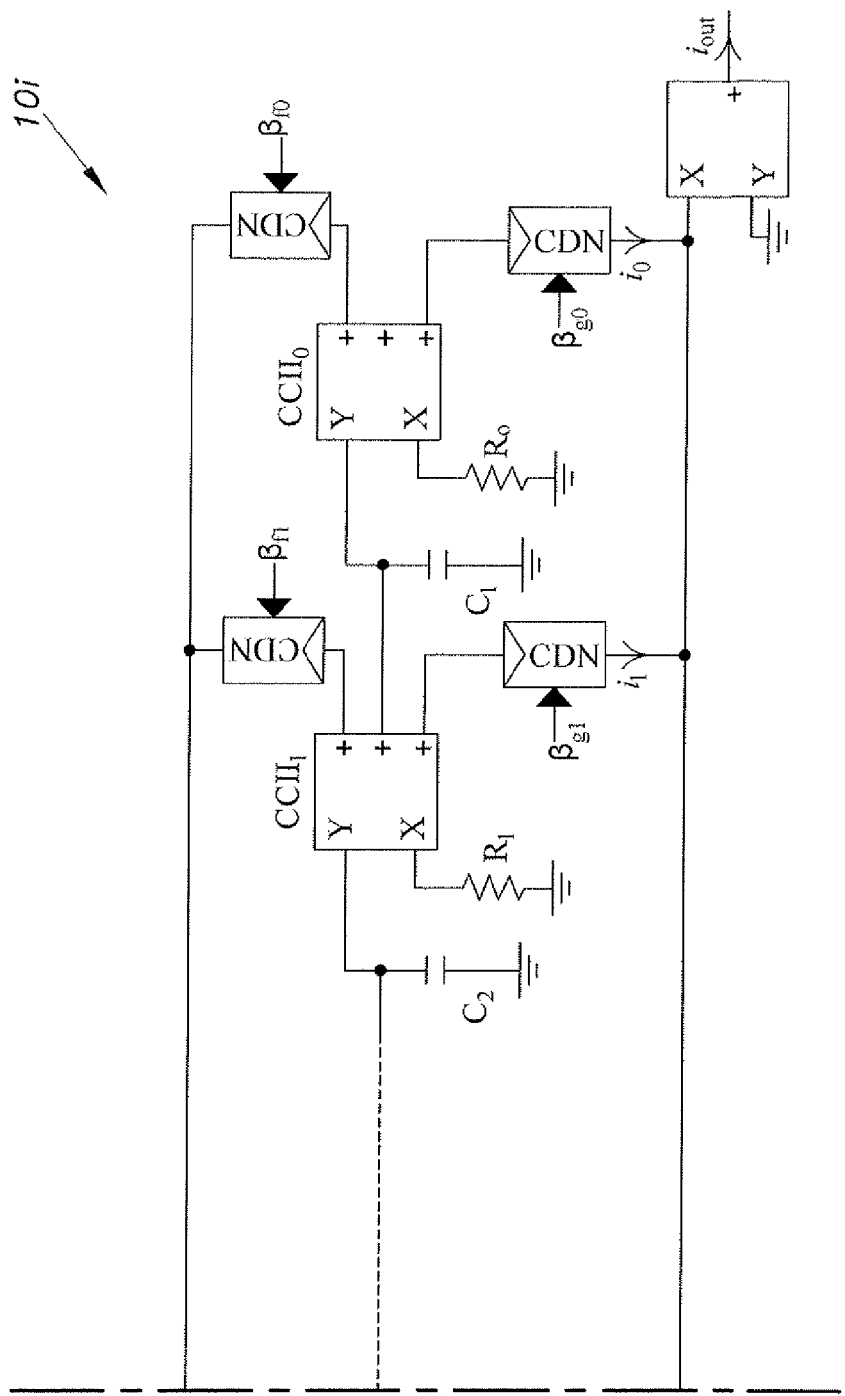
Figure 21:
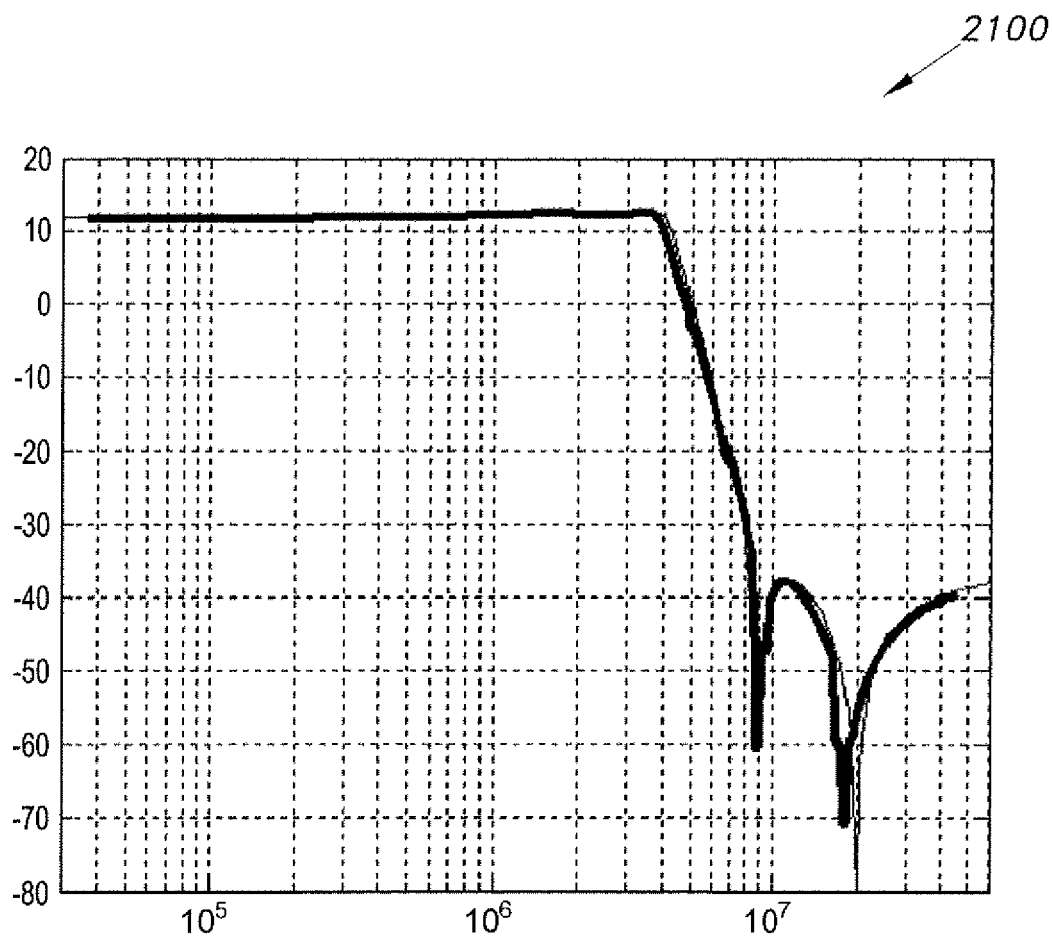
FIG. 21 is a plot of gain vs. frequency, showing the low pass elliptic response of the filter of FIGS. 16A-16B.

Filter 10i, shown in FIGS. 16A-16B, was designed to realize a low pass Butterworth response with a pole frequency of 4 MHz and a gain of 12 dB. The CDNs are programmed to reconfigure the filter to provide elliptic response with a stop frequency of 8 MHz, a passband variation of less than 0.5 dB, and a stopband attenuation of more than 40 dB. The corresponding values of various β's are given in Table V. The experimental results of these configurations are shown in plots 2000 and 2100 of FIG. 20 and FIG. 21, respectively. As shown in FIGS. 17 through 20 the experimental results are in very good agreement with the theoretical responses.

Table IV: Values of βs in the filter of FIG. 15(b) to achieve Butterworth and elliptic responses.

TABLE V

Values of βs in the filter of FIG. 16A-16B

| | Butter-worth 4 MHz | Closest | Digital | Elliptic | Closest | Digital |
|---|---|---|---|---|---|---|
| $\beta_0$ | 0.0083 | 0.0078 | 00000010 | 0.0036 | 0.0039 | 00000001 |
| $\beta_1$ | 0.072 | 0.074 | 00010011 | 0.0292 | 0.0273 | 00000111 |
| $\beta_2$ | 0.311 | 0.313 | 01010000 | 0.1582 | 0.1563 | 00101000 |
| $\beta_3$ | 0.788 | 0.789 | 11000100 | 0.3576 | 0.3555 | 01011011 |
| $\beta_{g0}$ | 0.0332 | 0.0352 | 00001001 | 0.0144 | 0.0156 | 00000100 |
| $\beta_{g2}$ | 0 | 0 | 00000000 | 0.0388 | 0.0391 | 00001010 |
| $\beta_{g4}$ | 0 | 0 | 00000000 | 0.0040 | 0.0039 | 00000001 |

SFGs 11a, 11b, and 20 of FIGS. 1A, 1B, 2, respectively, suggest that at least n+1 active devices are required to provide the desired general transfer function (1). But, in order to promote the programmability feature, another n+1 and n active devices are conventionally incorporated for adjusting the coefficients $a_0$ through $a_n$ and $b_o$ through $b_{n-1}$, respectively. The number of active devices can be reduced by using multi-output devices. But that approach traditionally leads to losing the programmability feature of N(s) and/or D(s) coefficients. In order to promote the programmability feature, devices having different current gains would be required. Clearly, design of such devices would often be unattractive from a power consumption point of view. The present approach manages to inject the desired programmability feature without increasing the power consumption through adopting external CDNs. Also, this approach provides another much needed feature, that is, eliminating analog switches from the signal path that often limit the linearity and frequency operation. The filters 10h and 10i, based on this approach, are implemented in 0.18 µm process and experimental results are provided. In fact, it can be concluded that the proposed filters 10h and 10i represent the most optimum designs for realizing RNOF, since they use almost the minimum number of active devices and employ the simplest active elements (CF and CCII, which is a VB with sensed output current).

It is to be understood that the present invention is not limited to the embodiments described above, but encompasses any and all embodiments within the scope of the following claims.

I claim:

1. A reconfigurable high-order integrated circuit filter, comprising:
   a plurality of current followers (CFs) arranged in cascade, the cascade having:
   a first stage current follower having an input, a single inverting output, and a single non-inverting output, the input being adapted for connection to a signal input to the filter;
   a final stage current follower having an input, a single inverting output, and first and second non-inverting outputs; and
   at least one intermediate stage current follower having an input, first and second inverting outputs, and first and second non-inverting outputs, the inverting output of the first stage current follower being connected to the input of the next succeeding current follower in the cascade, the first inverting output of the at least one intermediate stage current follower being connected to its own input;
   a plurality of resistor-capacitor (RC) integrators, the at least one intermediate stage current follower and the final stage current follower having a corresponding one of the RC integrators connected to its corresponding input, the first inverting output of the at least one intermediate stage current follower and the final stage current follower being connected to the corresponding RC integrator at its corresponding input;
   a plurality of external feedback current division networks (CDNs), the at least one intermediate stage current follower and the final stage current follower each having a corresponding one of the CDNs disposed in a feedback loop between the first non-inverting output of the respective one of the at least one intermediate stage current follower and the final stage current follower and the input of the first stage current follower;
   a summing current follower having an input and an output, the output of the summing current follower being the output of the filter; and
   a plurality of external feed forward current division networks (CDNs), the first stage current follower having a corresponding one of the feed forward CDNs connected in a feed forward loop from its non-inverting output to the input of the summing current follower, each of the succeeding current followers having a corresponding one of the feed forward CDNs disposed in a feed forward loop from its second non-inverting output to the input of the summing current follower;
   wherein each of the feedback CDNs has an input accepting a $\beta_f$ filter coefficient control signal unique to the feedback CDN and each of the feed forward CDNs has an input accepting a $\beta_g$ filter coefficient control signal unique to the feed forward CDN;
   whereby the filter has a transfer function characterized by the relation:

$$\frac{i_m(s)}{i_s(s)} = \frac{s^m \beta_{gm} \prod_{i=m}^{n-1} \frac{1}{C_{i+1} R_i}}{s^n + \sum_{i=0}^{n-1} \beta_{fi} s^i \prod_{j=i}^{n-1} \frac{1}{C_{j+1} R_j}}$$

for $m = 0$ to $n - 1$, in which $\beta_{gm}$ is the transfer function numerator coefficient parameter configurable by adjusting the control signals to the feed forward CDNs and $\beta_{fi}$ is the transfer function denominator coefficient parameter configurable by adjusting the control signals to the feedback CDNs, where $i_m(s)$ represents a Laplace transform of an output of the filter in the s-domain, and $i_s(s)$ represents a Laplace transform of an input of the filter in the s-domain.

2. The reconfigurable high-order integrated circuit filter according to claim 1, wherein said CDN control signals comprise of eight digital bits, thereby allowing said $\beta_{gm}$ and $\beta_{fi}$ filter coefficients to be adjusted from 0 to about 0.9961 with a resolution of approximately 0.00391 in 255 steps.

3. The reconfigurable high-order integrated circuit filter according to claim 1, wherein the filter is configurable to obtain a 4th-order low pass Butterworth response having a passband frequency of about 5 MHz and gain of about 12 dB.

4. The reconfigurable high-order integrated circuit filter according to claim 3, wherein the filter is reconfigurable to obtain said 4th-order low pass Butterworth response and gain at a lower passband frequency extending down to about 3.2 MHz.

5. The reconfigurable high-order integrated circuit filter according to claim 1, wherein the filter is configurable to obtain Chebyshev responses at a passband frequency of about 5 MHz.

6. The reconfigurable high-order integrated circuit filter according to claim 5, wherein the filter is reconfigurable to obtain said Chebyshev responses at a higher passband frequency extending up to approximately 10 MHz.

* * * * *